US008232818B2

(12) United States Patent
Desta et al.

(10) Patent No.: US 8,232,818 B2
(45) Date of Patent: Jul. 31, 2012

(54) PROBE HEAD FOR A MICROELECTRONIC CONTACTOR ASSEMBLY, THE PROBE HEAD HAVING SMT ELECTRONIC COMPONENTS THEREON

(75) Inventors: Yohannes Desta, Baton Rouge, LA (US); Lakshmikanth Namburi, Duarte, CA (US); Matthew Losey, Alta Loma, CA (US)

(73) Assignee: Advantest America, Inc., Cupertino, CA (US)

( * ) Notice: Subject to any disclaimer, the term of this patent is extended or adjusted under 35 U.S.C. 154(b) by 350 days.

(21) Appl. No.: 12/709,297

(22) Filed: Feb. 19, 2010

(65) Prior Publication Data
US 2010/0237889 A1 Sep. 23, 2010

Related U.S. Application Data
(60) Provisional application No. 61/153,731, filed on Feb. 19, 2009.

(51) Int. Cl.
*G01R 31/00* (2006.01)
(52) U.S. Cl. ......... 324/756.01; 324/757.01; 324/756.03; 439/842
(58) Field of Classification Search .................. None
See application file for complete search history.

(56) References Cited

U.S. PATENT DOCUMENTS

| | | | |
|---|---|---|---|
| 6,509,751 B1 | 1/2003 | Mathieu et al. | |
| 6,771,084 B2 | 8/2004 | DiStefano | |
| 6,799,976 B1 | 10/2004 | Mok et al. | |
| 6,891,360 B1 | 5/2005 | Beaman et al. | |
| 7,132,839 B2 * | 11/2006 | Zaerpoor | 324/756.04 |
| 7,180,316 B1 | 2/2007 | Ismail et al. | |
| 7,245,135 B2 | 7/2007 | Ismail et al. | |
| 7,246,984 B2 | 7/2007 | Sarumaru et al. | |
| 7,271,022 B2 | 9/2007 | Tang et al. | |
| 7,362,119 B2 | 4/2008 | Khoo et al. | |
| 7,538,565 B1 * | 5/2009 | Beaman et al. | 324/755.11 |
| 7,586,316 B2 | 9/2009 | Kuniyoshi et al. | |
| 7,589,542 B2 | 9/2009 | Khoo et al. | |
| 2003/0076124 A1 | 4/2003 | Zaiser | |
| 2004/0239349 A1 | 12/2004 | Yamagishi et al. | |
| 2006/0125501 A1 | 6/2006 | Liu et al. | |
| 2006/0250150 A1 | 11/2006 | Tunaboylu et al. | |
| 2007/0075717 A1 | 4/2007 | Kinghorn et al. | |
| 2007/0126443 A1 | 6/2007 | Grube et al. | |
| 2008/0030214 A1 | 2/2008 | Nguyen et al. | |
| 2008/0180118 A1 | 7/2008 | Itou et al. | |
| 2008/0246501 A1 | 10/2008 | Williams et al. | |
| 2008/0278185 A1 | 11/2008 | Chen | |
| 2009/0237099 A1 | 9/2009 | Garabedian et al. | |

FOREIGN PATENT DOCUMENTS

JP          1031034          2/1998
(Continued)

OTHER PUBLICATIONS

International Search Report and Written Opinion mailed Sep. 29, 2010 for application No. PCT/US2010/024817, 10 pages.

*Primary Examiner* — Melissa Koval
*Assistant Examiner* — Trung Nguyen
(74) *Attorney, Agent, or Firm* — Holland & Hart LLP

(57) ABSTRACT

A probe head for a microelectronic contactor assembly includes a space transformer substrate and a probe contactor substrate. Surface mount technology (SMT) electronic components are positioned close to conductive elements on the probe contactor substrate by placing the SMT electronic components in cavities in the probe contactor substrate, which cavities may be through-hole or non-through-hole cavities. In some cases, the SMT electronic components may be placed on pedestal substrates. SMT electronic components may also be positioned between the probe contactor and space transformer substrates.

23 Claims, 20 Drawing Sheets

FOREIGN PATENT DOCUMENTS

| | | |
|---|---|---|
| JP | 10031034 A | 2/1998 |
| JP | 2008170413 A | 7/2008 |
| JP | 2008268196 A | 11/2008 |
| KR | 1020010111118 A | 12/2001 |
| KR | 1020030010256 A | 2/2003 |
| KR | 1020030013810 A | 2/2003 |
| KR | 1020060088416 A | 8/2006 |
| KR | 1020070016193 A | 2/2007 |
| KR | 100791945 B1 | 1/2008 |
| KR | 1020090014755 A | 2/2009 |
| WO | 9615458 A1 | 5/1996 |
| WO | 2008126601 A1 | 10/2008 |

* cited by examiner

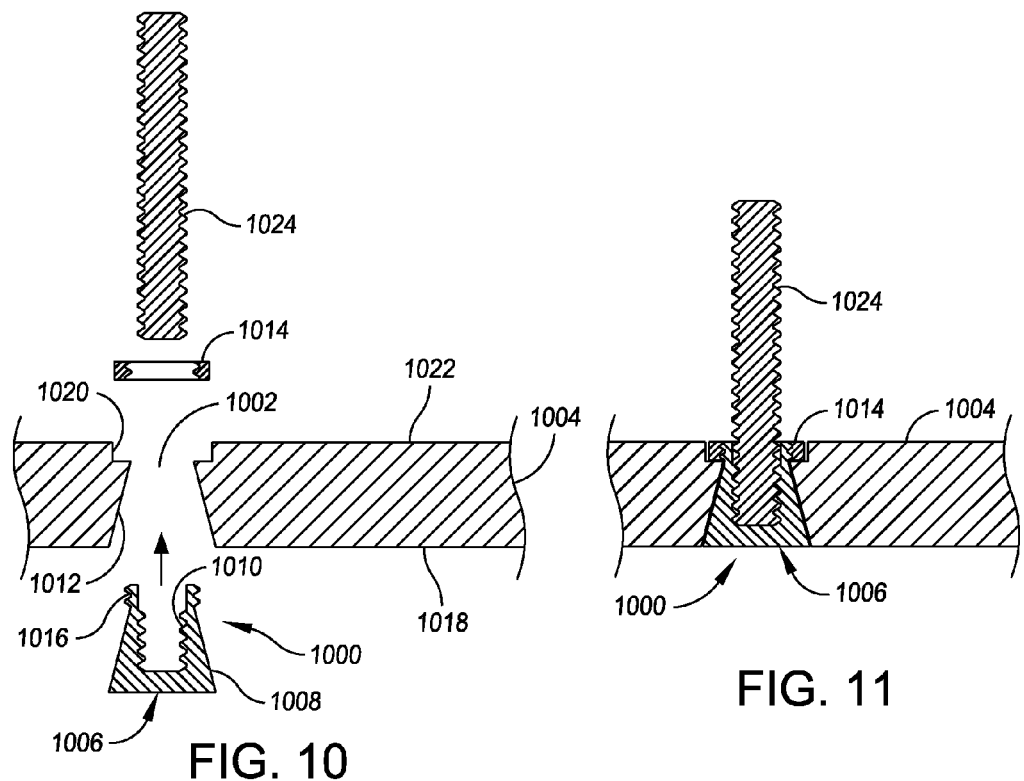
FIG. 10
FIG. 11
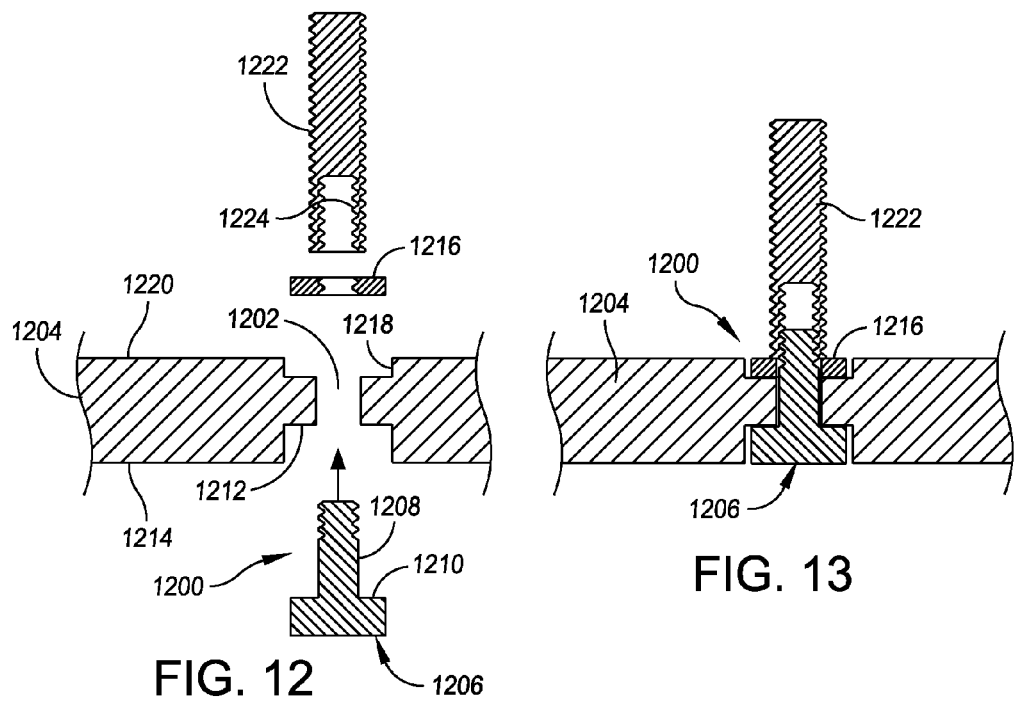
FIG. 12
FIG. 13

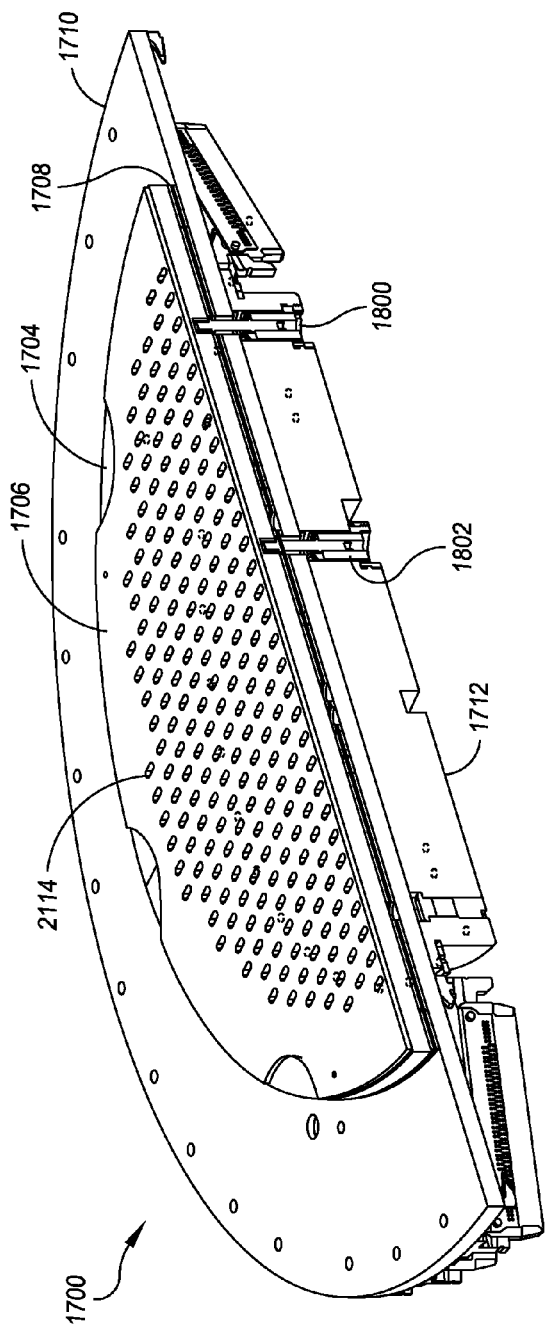
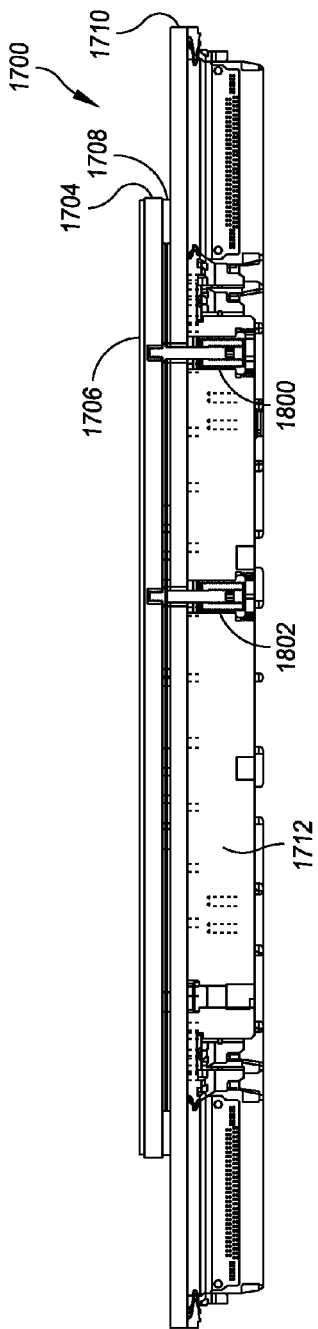
FIG. 19
FIG. 20

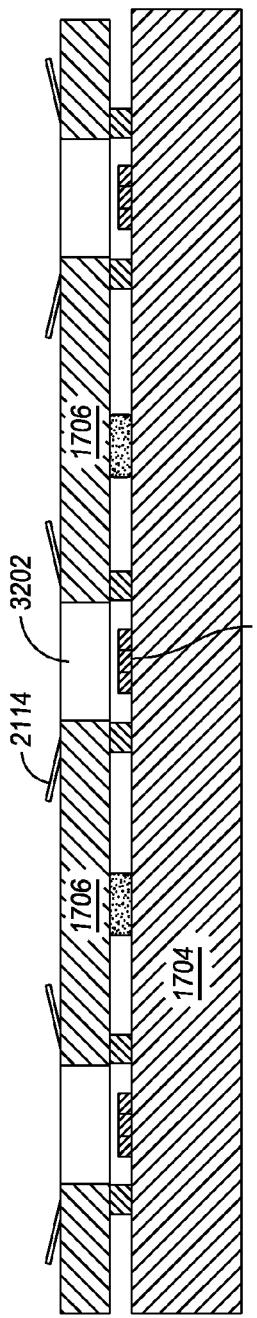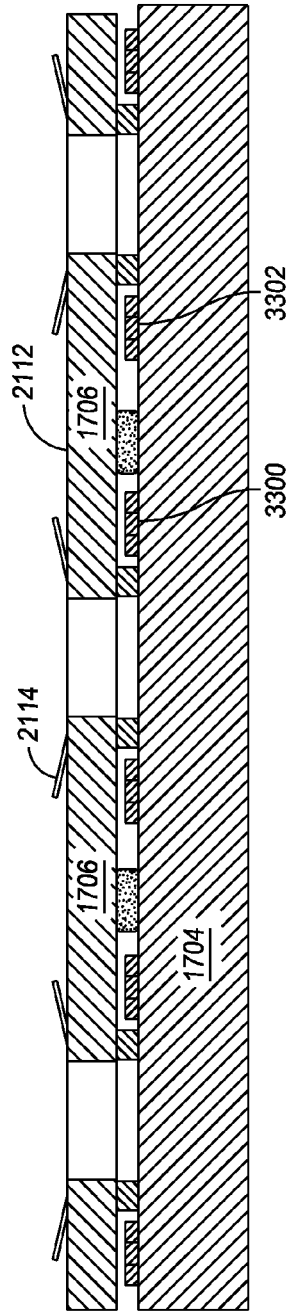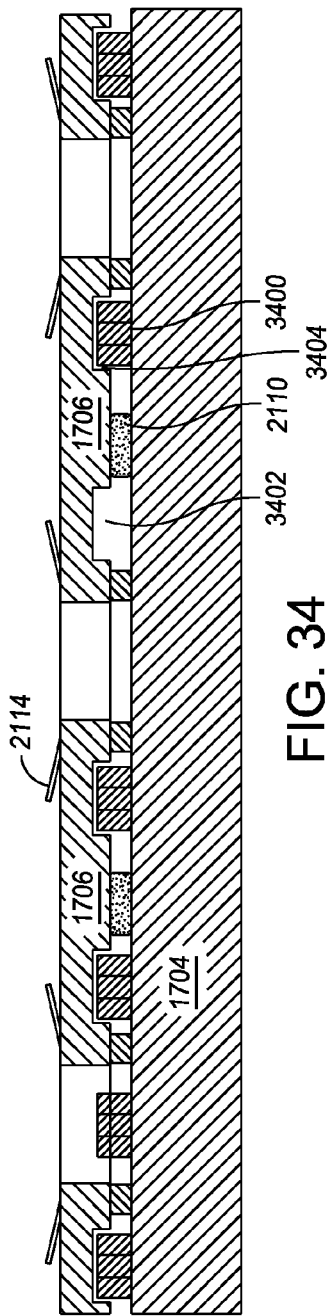

PROBE HEAD FOR A MICROELECTRONIC CONTACTOR ASSEMBLY, THE PROBE HEAD HAVING SMT ELECTRONIC COMPONENTS THEREON

CROSS-REFERENCE TO RELATED APPLICATION

This application claims the benefit of U.S. Provisional Application No. 61/153,731, filed Feb. 19, 2009, the disclosure of which is hereby incorporated by reference.

BACKGROUND

Typically, semiconductor chips are tested to verify that they function appropriately and reliably. This is often done when the semiconductor chips are still in wafer form, that is, before the are diced from the wafer and packaged. This allows the simultaneous testing of many semiconductor chips in parallel, creating considerable advantages in cost and process time compared to testing individual chips once they are packaged. If chips are found to be defective, they may be discarded when the chips are diced from the wafer, and only the reliable chips need be packaged. Semiconductor chips may also be tested after dicing, but before packaging, by assembling die on tape or a mechanical carrier.

Generally, modern microfabricated (termed MEMS) microelectronic contactor assemblies, including probe card assemblies for testing semiconductors, have at least three components: a printed circuit board (PCB), a substrate to which thousands of microelectronic contactors are coupled (which substrate may be referred to as the "probe contactor substrate"), and a compressible electrical interconnect (often in the form of an electrical "interposer"). The compressible electrical interconnect electrically connects the individual electrical contacts of the PCB to corresponding electrical contacts on the probe contactor substrate, which probe contactor substrate then relays signals to and from individual microelectronic contactors. The combination of the probe contactor substrate and its microelectronic contactors is sometimes referred to as a probe head.

The microelectronic contactors on the probe contactor substrate often have a very fine pitch (i.e., small distances between contactors, such as 30 μm to 200 μm) while the electrical contacts of the PCB and the interposer often have coarser pitches (>200 μm). Thus, in modern MEMS probe card assemblies, the probe contactor substrate often provides a space transformation of electrical contracts as it connects the finely pitched microelectronic contactors to the coarser pitched electrical contacts found on the interposer and PCB. Alternately, part or all of this space transformation may be off-loaded to a separate space transformer substrate of the probe head, or to other substrates or components. It is noted that some probe card assemblies do not utilize an interposer, but the general idea is unchanged.

In most applications, the required number of interconnects that need to be made between the substrates of a probe card assembly are in the thousands or tens of thousands, dictating that the PCB and the probe head be parallel (or very close to parallel), and in close proximity, so that the many interconnects therebetween can be reliably made. It is also noted that the vertical space between the PCB and the probe contactor substrate is generally constrained to only a few millimeters.

So that reliable connections to a wafer or other array of semiconductor devices can also be made, it is also important that the tips of the microelectronic contactors on the probe head lie essentially in a plane. The background of U.S. Pat. No. 7,180,316, titled "Probe Head with Machined Mounting Pads and Method of Forming Same," assigned to Touchdown Technologies, Inc. of Baldwin Park, Calif., discusses the importance of the planarity of the microelectronic contactor tips (or probe tips).

Reliable connections to the pads on a semiconductor wafer become evermore difficult as semiconductor dies and their pads continue to shrink in size and pitch, and as the number of electrical contacts between a probe head and a wafer under test increases (e.g., as the semiconductor test industry enters the era of one touchdown full wafer test). Currently, the bond pads on a wafer can be as small as 30 μm square, but are more typically 50 μm square. The contacts to the bond pads must stay well within the boundaries of the bond pads, and preferably near their centers, as any contact with the peripheries of the bond pads can damage the pads and cause yield loss. Because the bond pads are distributed across the entire surface of a wafer (e.g., across a 300 mm diameter array), precision alignment of microelectronic contactors and bond pads is becoming more and more critical. An approach which binds all of the microelectronic contactors to a single plane, without any need for mechanical adjustment, would be preferred.

BRIEF DESCRIPTION OF THE DRAWINGS

Illustrative embodiments of the invention are illustrated in the drawings, in which:

FIGS. 10-13 illustrate other exemplary types of probe head inserts, with FIGS. 10 & 12 illustrating the inserts before they are anchored in a substrate; and with FIGS. 11 & 13 illustrating the inserts after each insert has been anchored in a substrate;

FIGS. 17-21 illustrate an exemplary microelectronic contactor assembly having a probe head with more than one major substrate;

FIGS. 32-34 illustrate the mounting of various SMT electronic components in various locations on a space transformer substrate.

Figure 1:
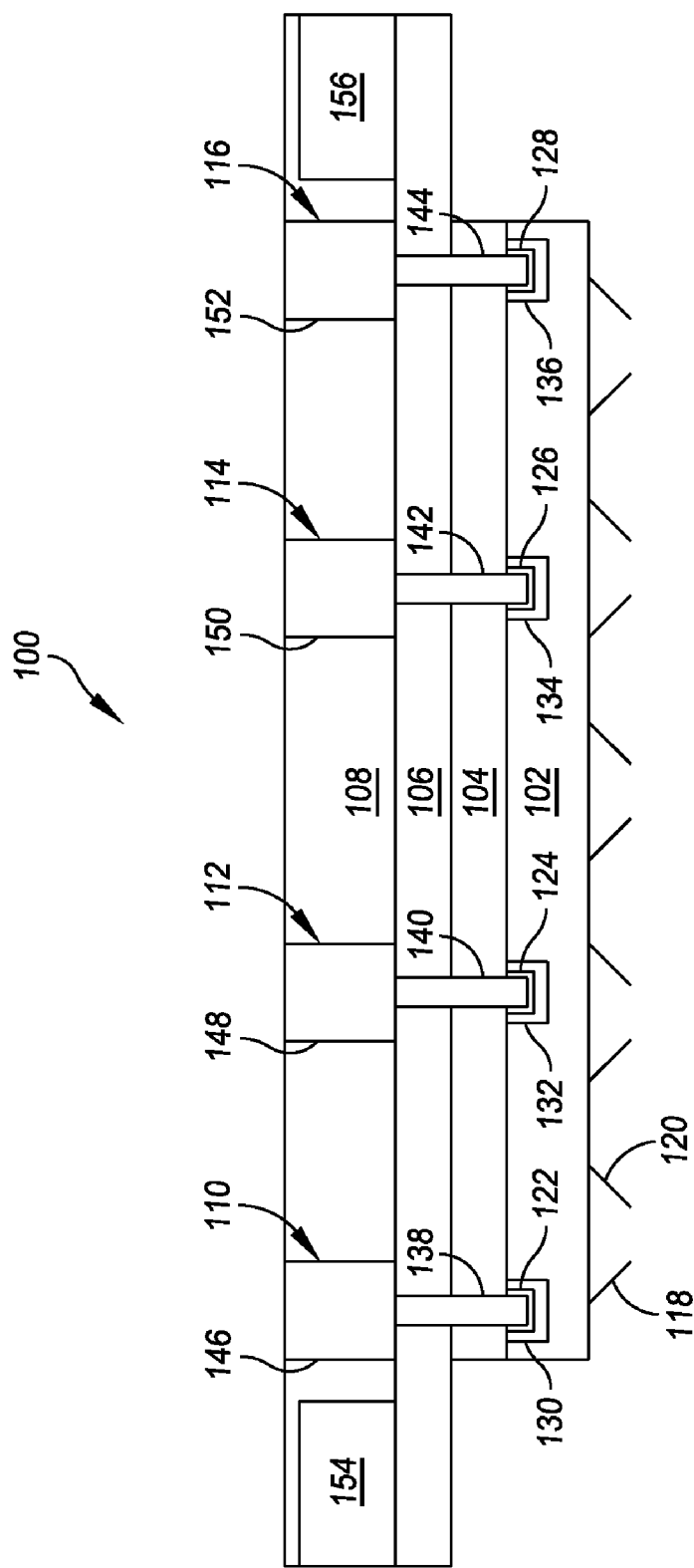
FIGS. 1 & 2 illustrate an exemplary embodiment of a microelectronic contactor assembly.

It is noted that, in the following description, like reference numbers appearing in different drawing figures refer to like elements/features. Often, therefore, like elements/features that appear in different drawing figures will not be described in detail with respect to each of the drawing figures.

DETAILED DESCRIPTION

Figure 2:
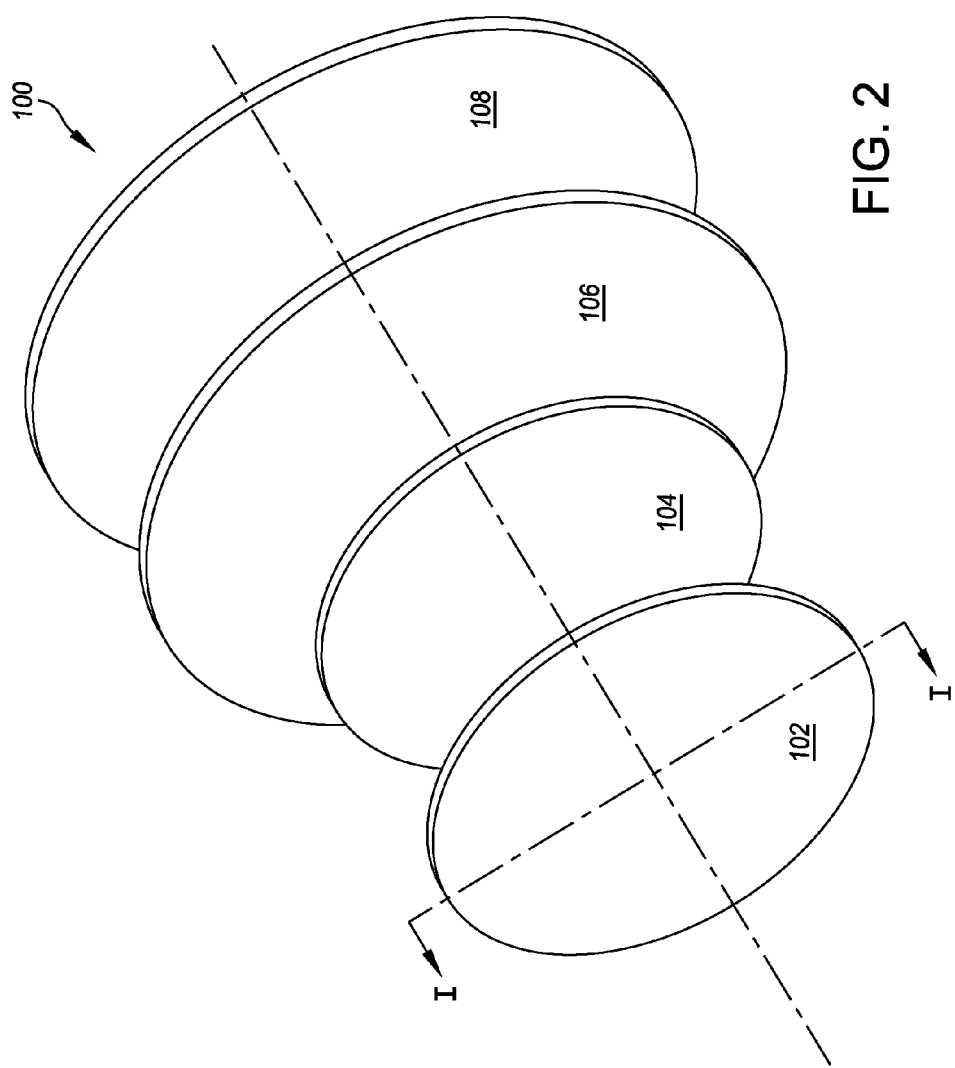

FIGS. 1 & 2 illustrate an embodiment of a microelectronic contactor assembly 100, which in some cases may be configured as a microelectronic wafer contactor assembly or probe card assembly (i.e., an assembly for contacting semiconductor devices on a wafer). FIG. 1 provides a cross-section of the assembly 100, and FIG. 2 provides an exploded perspective view of the assembly's principal components (less the multi-part fasteners 110, 112, 114, 116 shown in FIG. 1).

The assembly 100 comprises a probe head 102, a compressible electrical interconnect 104, a circuit board 106, a stiffener 108 and a plurality of adjustable multi-part fasteners (e.g., 110, 112, 114 and 116). The circuit board 106 is disposed between the probe head 102 and the stiffener 108, and the compressible electrical interconnect 104 is disposed between the probe head 102 and the circuit board 106.

The probe head 102 has a plurality of microelectronic contactors (e.g., 118 and 120). These contactors 118, 120 are electrically connected to the circuit board 106, at least in part, by electrical connections that the compressible electrical interconnect 104 provides between the probe head 102 and the circuit board 106. The probe head 102 further has a plurality of inserts (e.g., 122, 124, 126 and 128) anchored therein. As used herein, the term "insert" refers to a device that is anchored in another device (e.g., a probe head 102) by extending into a hole (e.g., 130, 132, 134 and 136) or recess in the other device.

Each of the adjustable multi-part fasteners 110, 112, 114, 116 has a shaft (e.g., 138, 140, 142 and 144) coupled to one of the plurality of inserts 122, 124, 126, 128 in the probe head 102, and a differential screw mechanism (e.g., 146, 148, 150 and 152) coupled to the stiffener 108, In some embodiments, one or more of the inserts 122, 124, 126, 128 may take the form of a receptacle, such as a threaded receptacle (or a receptacle having a cam formed on an interior surface thereof). A shaft 138 of one of the multi-part fasteners 110 may be removably or fixedly threaded in (or attached to) each receptacle, in the same or different embodiments, one or more of the inserts 122, 124, 126, 128 may be integrally formed, molded or machined with its corresponding shaft 138, 140, 142, 144 of the multi-part fastener 110, 112, 114, 116. Or, an insert may comprise a stud to which a shaft of a multi-part fastener connects. Operation of the differential screw mechanisms 146, 148, 150, 152 can help provide a desired amount of compression to the compressible electrical interconnect 104 by moving the shafts 138, 140, 142, 144 in either direction along their axes. Alternately, or additionally, operation of the differential screw mechanisms 146, 148, 150, 152 can help maintain or adjust i) the planarity of a surface of the probe head 102 or ii) the planarity of features (e.g., tips) of the microelectronic contactors 118, 120.

In use, electrical signals may be transmitted between one or more devices connected to the microelectronic contactors 118, 120 and equipment connected to the circuit board 106. By way of example, the circuit board 106 may be provided with electrical contacts or connectors (e.g., 154 and 156) for electrically connecting the circuit board 106 to other equipment. In some embodiments, the device(s) connected to the microelectronic contactors 118, 120 may be semiconductor devices under test (DUTs), such as semiconductor chips on a wafer, and the equipment to which the circuit board 106 is connected may be test equipment such as automated test equipment (ATE).

Having described some of the components and features of the microelectronic contactor assembly 100 in general, these components and features will now be described in greater detail, along with various alternative embodiments of the microelectronic contactor assembly 100; optional components of the microelectronic contactor assembly 100; and methods of making and assembling same.

Figure 3:
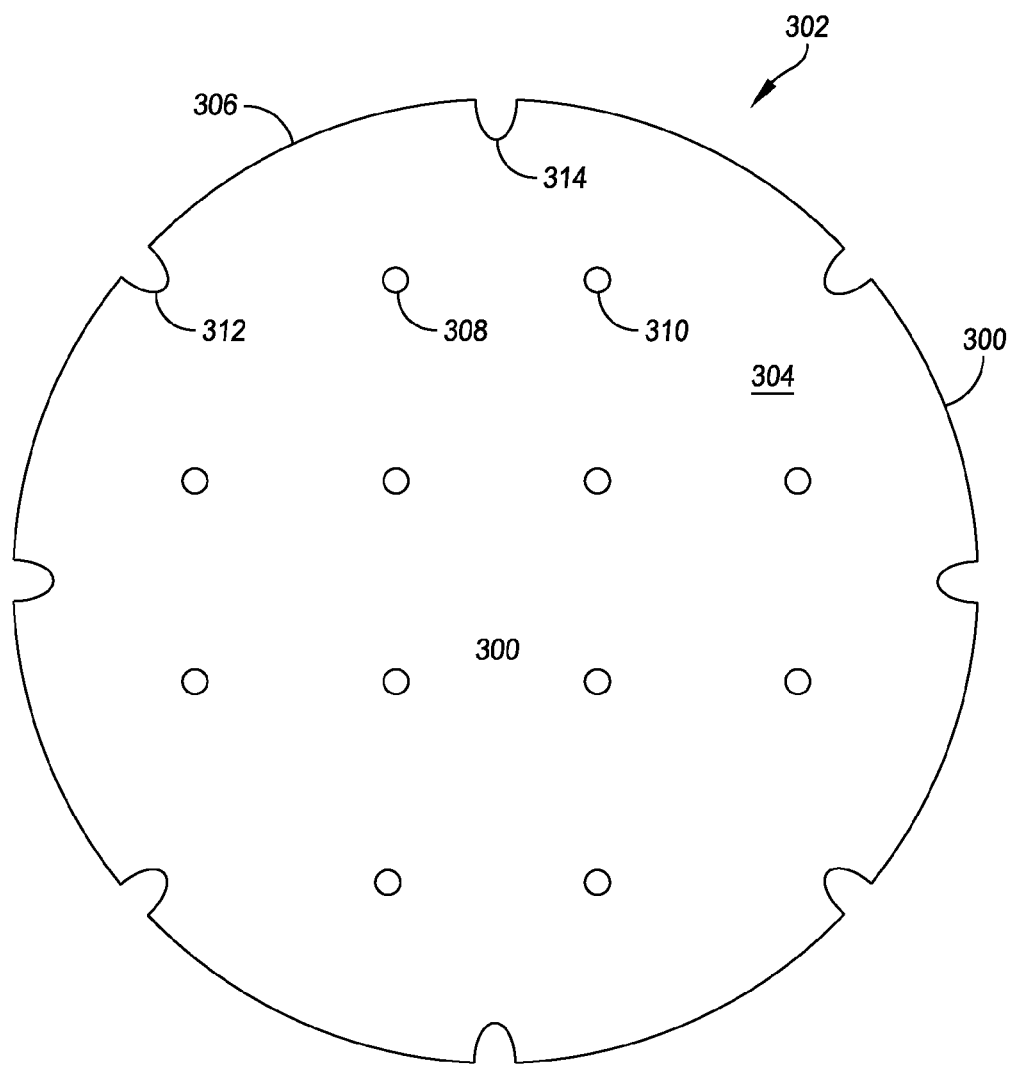
FIG. 3 provides a plan view of a substrate of a first exemplary probe head that may be used with the microelectronic contactor assembly shown in FIGS. 1 & 2.

FIG. 3 provides a plan view of a substrate 300 of a first exemplary probe head 302. The surface 304 of the substrate 300 is bounded by a periphery 306. The surface 304 has a plurality of holes (e.g., 308 and 310), and the periphery 306 has a plurality of edge recesses (e.g., 312 and 314). The holes 308, 310 may be blind holes or through-holes and may be formed, for example, by drilling or routing processes. The edge recesses 312, 314 may be formed, for example, by any of the processes used to form the holes 308, 310. The holes 308, 310 and edge recesses 312, 314 may be formed using the same or different processes.

Figure 4:
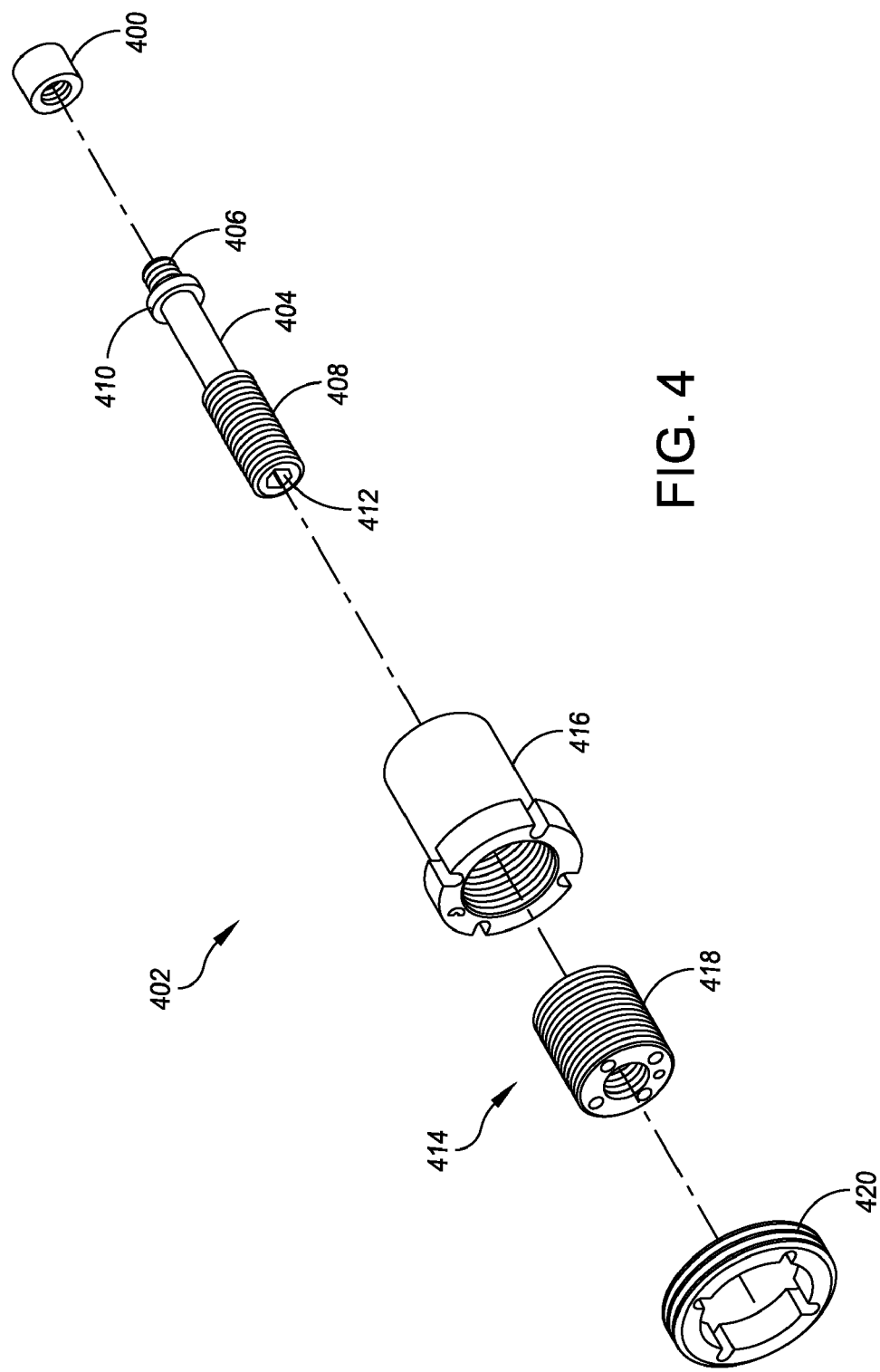
FIG. 4 illustrates an exemplary insert that may be anchored in one of the holes shown in FIG. 3.
Figure 5:
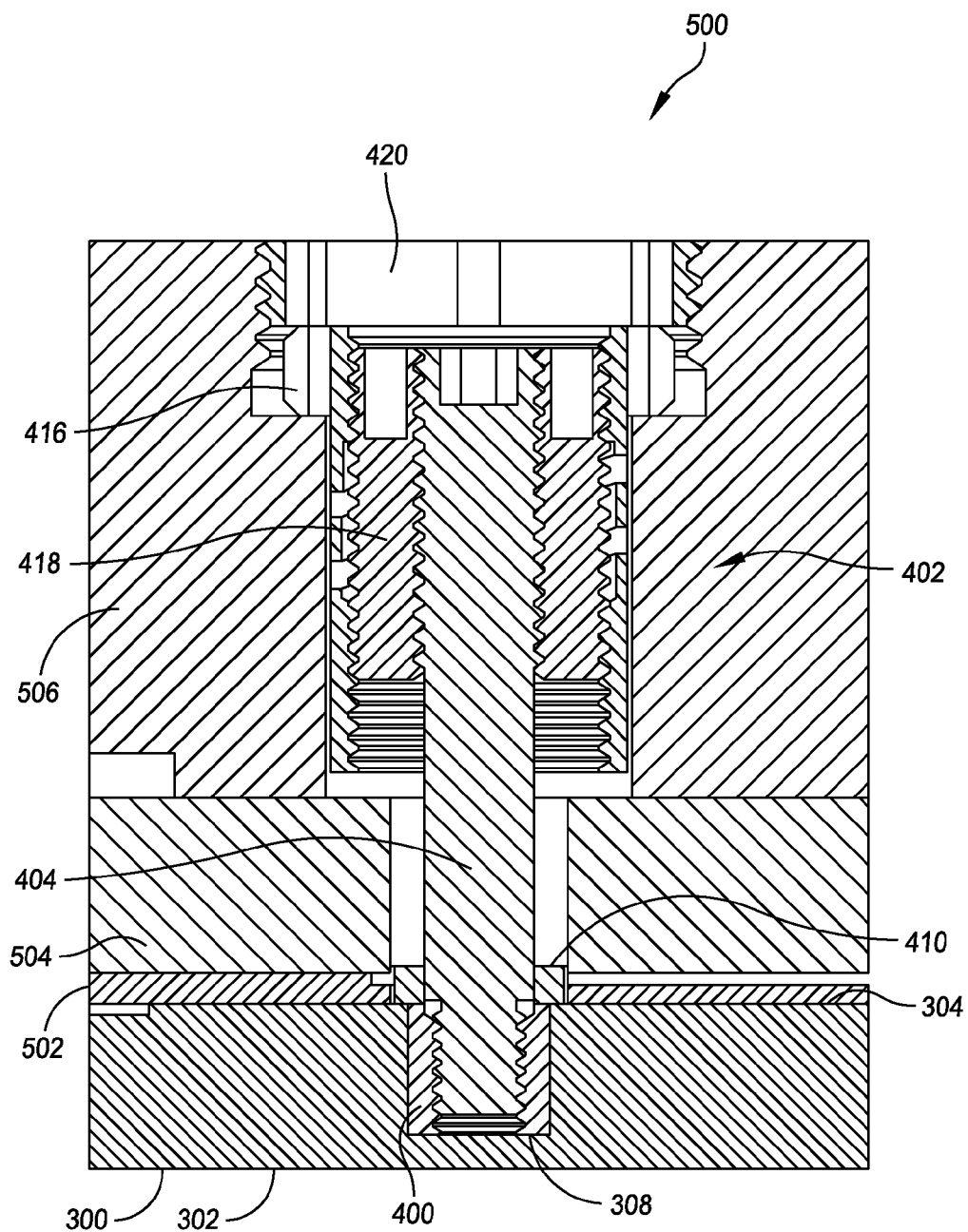
FIG. 5 illustrates a cross-section of a portion of a microelectronic contactor assembly, which cross-section shows how the insert and multi-part fastener shown in FIG. 4 are used to couple all of: the substrate shown in FIG. 3, a compressible electrical interconnect, a circuit board, and a stiffener.

FIG. 4 illustrates an exemplary insert 400 that may be anchored in one of the holes 308 shown in FIG. 3. FIG. 4 also illustrates exemplary components of a multi-part fastener 402 haying a shaft 404 that may be coupled to the insert 400. FIG. 5 illustrates a cross-section of a portion of a microelectronic contactor assembly 500, which cross-section shows how the insert 400 and multi-part fastener 402 are used to couple all of: the substrate 300 of the probe head 302, a compressible electrical interconnect 502, a circuit board 504, and a stiffener 506.

Referring now to FIG. 4, the insert 400 is shown to be a threaded receptacle. The insert 400 may be formed from Kovar or other materials, and is preferably formed of a material that has a coefficient of thermal expansion (CTE) that is close to (or matched to) the CTE of the substrate in which it is anchored. The shaft 404 has threads 406, 408 at each end. An optional collar 410 may limit the extent to which the shaft 404 can be screwed into the insert 400. An axially aligned hexagonal opening 412 or other feature may be provided on the shaft 404 to facilitate screwing the shaft 404 into the insert 400. The differential screw mechanism 414 comprises a bushing 416 having a threaded interior. The differential shaft 418 has exterior threads that allow the differential shaft 418 to be screwed into the bushing 416, and interior threads that allow the shaft 404 to be screwed into the differential shaft 418. The multi-part fastener 402 or differential screw mechanism 414 may further comprise a lock mechanism 420, such as a lock ring. The lock mechanism 420 can be used to prevent unintentional operation of the differential screw mechanism 414. By way of example, the components of the multi-part fastener 402 may be formed of one or more metals. In some embodiments, the shaft 404, bushing 416 and lock ring 420 may be formed of stainless steel, and the differential shaft 418 may be formed of brass.

FIG. 5 illustrates the insert 400 after it is anchored in the hole 308 in the surface 304 of the substrate 300. In some embodiments, the hole 308 may be formed somewhat larger than the width and height of the insert 400 so that the insert 400 may be precisely positioned in x, y, z and theta with respect to the probe head 302. After the insert 400 is positioned, it may be anchored in the substrate 300 using adhesive, such as an epoxy-based adhesive. Alternately, the insert may be anchored, for example, by means of soldering or brazing. The somewhat larger height and width of the hole 308 with respect to the insert 400 allows the insert 400 to be insulated from the substrate 300. Insulation can be especially useful when the substrate 300 contains conductive layers or electrical interconnects that might otherwise be contacted, shorted or influenced by a conductive insert 400. The somewhat larger diameter of the hole 308 can also provide other advantages, such as an ability to anchor the insert 400 in the substrate 300 more securely, or an ability to anchor the insert 400 using a material that bridges a CTE mismatch between the insert 400 and substrate 300. Alternatively, the hole 308 in which the insert 400 is anchored may have dimensions that are the same, or about the same, as the outer dimensions of the insert 400. In such an embodiment, the exterior of the insert 400 may in some cases be provided with threads or other features that are capable of engaging or cutting into the substrate 300.

FIG. 5 also illustrates how the components of the multi-part fastener 402 are coupled with each other and with the insert 400. The bushing 416 may be press-fit into the stiffener 506. Alternately, the bushing 416 may be anchored in the stiffener 506 in other ways (e.g., by means of adhesive, solder or brazing). The differential screw mechanism 414 may be operated by a person, by a person using a hand tool, or by a machine (e.g., by a computer). While operating the differential screw mechanism 414, one or more of the following, or other parameters, may be monitored for a desired outcome: a compression of the compressible electrical interconnect 502 about the multi-part fastener 402; the planarity of a surface of the probe head 302; or the planarity of features (e.g., tips) of microelectronic contactors on the probe head 302. Upon a desired outcome being achieved, operation of the differential screw mechanism 414 may cease, and the lock mechanism 420 may be tightened to prevent unintentional operation of the differential screw mechanism 414. As shown, exterior threads of the lock mechanism 420 may engage corresponding threads in the stiffener 506.

Figure 6:
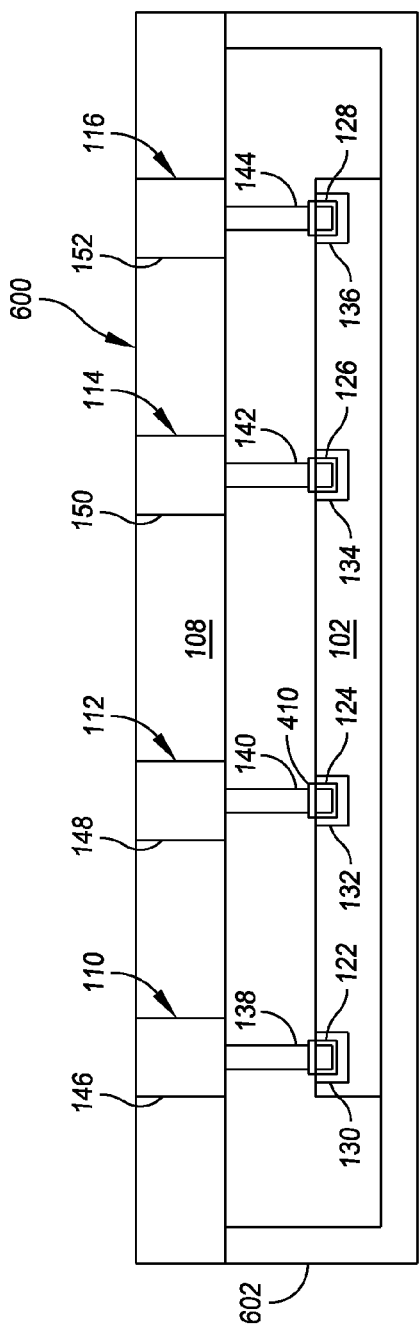
FIG. 6 illustrates a fixture that simultaneously holds a plurality of inserts in their desired positions as they are inserted into a probe head.

Threaded receptacles or other inserts 400 may be anchored in each of a plurality of holes 308, 310 in a probe head 302. For example, inserts 400 may be anchored in each of the holes 308, 310 shown in FIG. 3. To ensure that each of a plurality of inserts is oriented in the same manner, and/or to ensure that features of the plurality of inserts are planar, a plurality of inserts 122, 124, 126, 128 may be simultaneously positioned in a plurality of holes 130, 132, 134, 136 using a fixture 600, 602 (FIG. 6) that simultaneously holds the plurality of inserts 122, 124, 126, 128 in their desired positions with respect to a probe head 102 or substrate thereof. In one embodiment, the fixture 600 may comprise a stiffener 108 of a microelectronic contactor assembly (or similar structure) which has a plurality of differential screw mechanisms 146, 148, 150, 152 coupled thereto. If each of a plurality of shafts 138, 140, 142, 144 coupled to the differential screw mechanisms 146, 148, 150, 152 is provided with a collar or other sort of mechanical stop, similarly to the collar 410 of the shaft 404 shown in FIG. 4, and if each of the differential screw mechanisms 146, 148, 150, 152 is operated to planarize the collars 410, then a plurality of inserts 122, 124, 126, 128 may be attached to the shafts 138, 140, 142, 144 in abutment to the mechanical stops on the shafts; and the plurality of inserts may be simultaneously positioned in respective holes 130, 132, 134, 136 in a probe head 102. The fixture 600 may be attached to a manual or automated machine that maintains the plurality of inserts 122, 124, 126, 128 planar to a surface or feature(s) of the probe head 302 as the inserts 122, 124, 126, 128 are positioned in the holes 130, 132, 134, 136. If an adhesive is used to anchor the inserts 122, 124, 126, 128 in the holes 130, 132, 134, 136, the adhesive may be applied to each insert 122, 124, 126, 128 and/or each hole 130, 132, 134, 136, prior to the machine positioning the inserts 122, 124 126, 128 in the holes 130, 132, 134, 136. Alternately, a plurality of inserts may be anchored by a process performed after the inserts are positioned in their holes—especially if the holes are through-holes and the inserts can be accessed from a side of the probe head 102 (or substrate thereof) opposite the shafts 138, 140, 142, 144. After anchoring the inserts 122, 124, 126, 128 in their respective holes 130, 132, 134, 136, the differential screw mechanisms 146, 148, 150, 152 may be operated to release the shafts 138, 140, 142, 144, and the shafts 138, 140, 142, 144 may then be removed from the inserts 122, 124, 126, 128.

Figure 7:
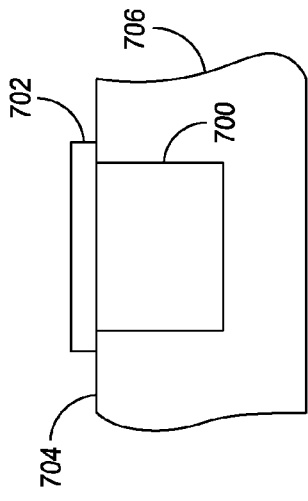
FIG. 7 illustrates a probe head insert having a lip that rests on the surface of a probe head substrate.

An insert 400 may be anchored in a hole 308 such that as surface of the insert is flush with a surface of the substrate 300 in which the hole 308 is formed (see, e.g., FIG. 5). A flush mounting can in some cases reduce the overall thickness of a microelectronic contactor assembly 500. Alternately, an insert 700 may be provided with a lip 702 or other feature that rests on the surface 704 of a substrate 706. See, for example, the lip 702 of the insert 700 shown in FIG. 7.

Regardless of whether a plurality of inserts have lips or features that rest on a surface of a substrate, and especially if the inserts do not have such lips or features, the inserts may be planarized by lapping their surfaces. If surfaces of the inserts are to be flush with the surface of the substrate in which they are anchored, the lapping may comprise simultaneously lapping the surfaces of the inserts and the surface of the substrate, as well as any adhesive or other substance that extends from the surface of the substrate. By way of example, this lapping may be performed using a diamond flycutting process.

Figure 8:
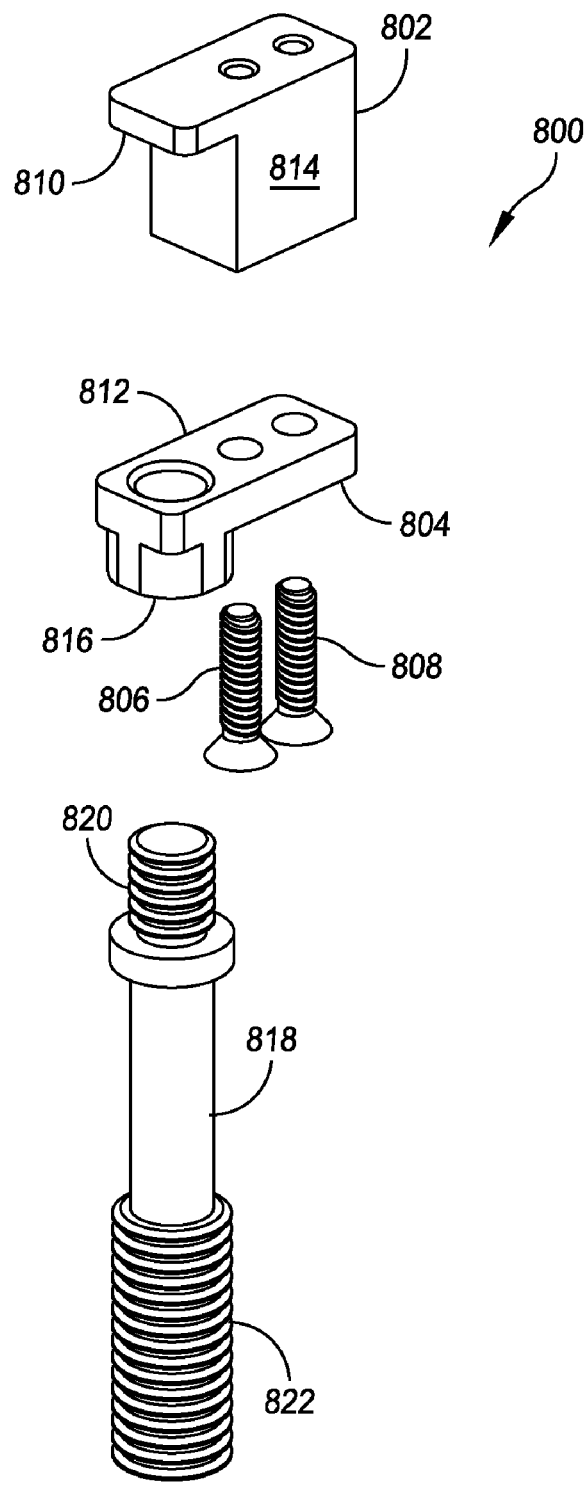
FIG. 8 illustrates an exemplary insert that may be anchored in one of the edge recesses shown in FIG. 3.
Figure 9:
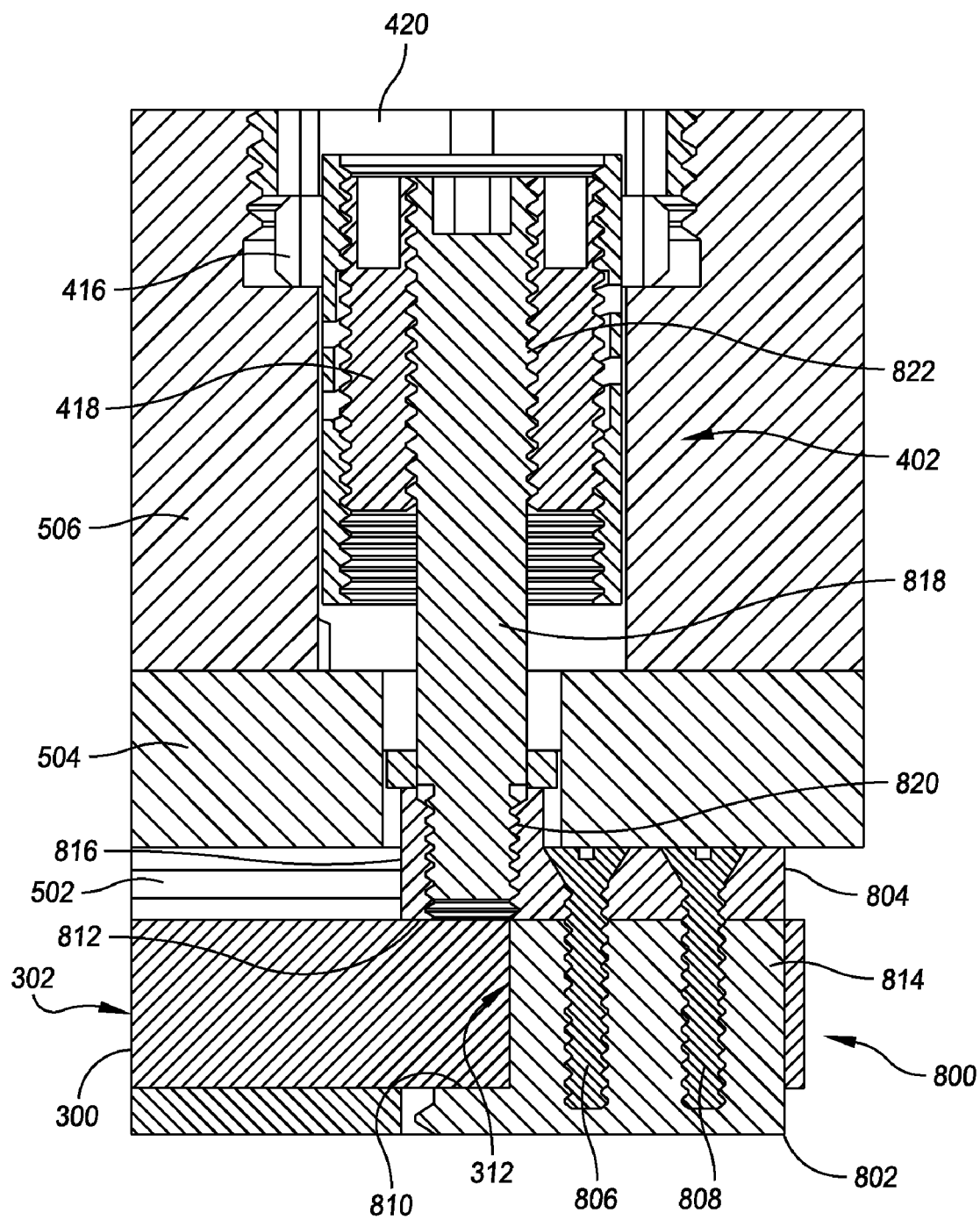
FIG. 9 illustrates a cross-section of a portion of as microelectronic contactor assembly, which cross-section shows how the insert shown in FIG. 8 is used in combination with a multi-part fastener like the one shown in FIG. 4 to couple all of: the substrate shown in FIG. 3, a compressible electrical interconnect, a circuit board, and a stiffener.

FIG. 8 illustrates an exemplary insert 800 that may be anchored in one of the edge recesses 312 shown in FIG. 3; and FIG. 9 illustrates a cross-section of a portion of a microelectronic contactor assembly 500, which cross-section shows how the insert 800, in combination with a multi-part fastener 402 like the one shown in FIG. 4, is used to couple all of: a substrate 300 of a probe head 302, a compressible electrical interconnect 502, a circuit board 504, and a stiffener 506.

Referring now to FIG. 8, the insert 800 is shown to be a clamp having first and second jaw members 802, 804 secured by a pair of screws 806, 808. Alternately, the jaw members 802, 804 could be secured by other means, or could be integrally formed. The jaw members 802, 804 could also be biased toward one another by a spring (not shown). The jaw members 802, 804 have respective surfaces 810, 812 for contacting (e.g., gripping) respective surfaces of the substrate 300 shown in FIGS. 3 & 9, and at least one of the jaw members 802 has a body portion 814 for insertion into a respective edge recess 312 (see FIG. 9) of the substrate 300. Attached to one of the jaw members 804 is a threaded receptacle 816. The jaw members 802, 804 and threaded receptacle 816 may be formed from Kovar or other materials, and are preferably formed of a material that has a coefficient of thermal expansion (CTE) that is close to (or matched to) the CTE of the substrate to which they are anchored. A shaft 818 having threads 820, 822 at each end, similar to the shaft 404 described with respect to FIG. 4, can be threaded into the threaded receptacle 816 of the insert 800.

FIG. 9 illustrates the insert 800 after it is anchored in an edge recess 312 of the substrate 300 of the probe head 302, in some cases, the insert 800 may be anchored in the substrate 300 using both a clamping force and a substance such as adhesive or solder. The jaw members 802, 804 of the clamp may rest on respective outer surfaces of the substrate 300. Or, in some cases, one or both of the jaw members 802, 804 may rest in a respective surface recess formed in the substrate 300. However, this requires thinning the substrate 300, and in some cases may make the substrate 300 too prone to breaking.

FIG. 9 also illustrates how the components of the multi-part fastener 402, including shaft 818 are coupled with each other and with the insert 800. These couplings are similar to the couplings described with respect to FIG. 5, and their descriptions are not repeated. Note, however, that the shaft 818 may be shorter than the shaft 404 (FIG. 5), because the jaw member 804 and threaded receptacle 816 sit on the surface 304 of the substrate 300.

FIGS. 10-13 illustrate other exemplary types of inserts 1000, 1200. The inserts 1000, 1200 are particularly adapted to be anchored in holes 1002, 1202, and particularly through-holes. However, because the inserts 1000, 1200 grip a probe head substrate 1004, 1204 therebetween, the inserts 1000, 1200, or variants thereof, may also be anchored in edge recesses of the substrate. FIGS. 10 & 12 illustrate the inserts 1000, 1200 before each insert 1000, 1200 is anchored in a substrate 1004, 1204; and FIGS. 11 & 13 illustrate the inserts 1000, 1200 after each insert 1000, 1200 has been anchored in a substrate 1004, 1204.

The insert 1000 (FIGS. 10 & 11) comprises a plug 1006 having a tapered exterior surface 1008 and a threaded bore 1010. The taper of the plug's exterior is configured to bear against a similarly tapered wall 1012 of a through-hole 1002 in the probe head substrate 1004. To retain the tapered plug 1006 in the through-hole 1002, a lock nut 1014 or other mechanical fastener may be screwed onto as threaded neck 1016 of the tapered plug 1006—opposite the side 1018 of the substrate 1004 through which the tapered plug 1006 was inserted. A fastener such as a nut or ring could also be attached to the plug 1006 by soldering, brazing or other means. In some cases, a recess 1020 may be provided in the surface 1022 of the substrate 1004, thereby allowing the lock nut 1014 to drop below the surface 1022 of the substrate 1004 when tightened. In other cases, the recess 1020 need not be provided, and the lock nut 1014 may bear against an outermost surface 1022 of the substrate 1004. A shaft 1024 of a multi-part fastener, similar to the shaft 404 shown in FIG. 4, may be screwed into the threaded bore 1010 of the insert 1000. Alternately, the shaft 1024 may take other forms, or may be integrally formed with the insert 1000.

The insert 1200 (FIGS. 12 & 13) comprises a plug 1206 having a threaded stud 1208 with a plate 1210 attached perpendicularly thereto. The plate 1210 is configured to bear against a surface 1212 of the substrate 1204. The surface 1212 which the plate 1210 bears against may be recessed within the substrate 1204, as shown, or may be an outermost surface 1214 of the substrate 1204. To retain the plug 1206 in the through-hole 1202, a lock nut 1216 or other mechanical fastener may be screwed onto the threaded stud 1208—opposite the side 1214 of the substrate 1204 through which the threaded stud 1208 was inserted. A fastener such as a nut or ring could also be attached to the plug 1006 by soldering, brazing or other means. In some cases, a recess 1218 may be provided in the surface 1220 of the substrate 1204, thereby allowing the lock nut 1216 to drop below the surface 1220 of the substrate 1204 when tightened. In other cases, the recess 1218 need not be provided, and the lock nut 1216 may bear against the outermost surface 1220 of the substrate 1204. A shaft of a multi-part fastener, such as a shaft 1222 having a threaded bore 1224, may be screwed onto the threaded stud 1208 of the insert 1200.

The inserts 900, 1000, 1200 shown in FIGS. 9-13 can be advantageous, in some applications, in that they do not require the use of an adhesive, solder, brazing or other chemical processing step to anchor the inserts 900, 1000, 1200 in a substrate. It is contemplated, however, that a chemical processing step may be used to additionally anchor the inserts 900, 1000, 1200, if desired.

It is noted that the above-described inserts are exemplary only. In other embodiments, the exterior or interior surfaces of the inserts may have other profiles or configurations. The inserts may also comprise bores or studs to which the shaft of a multi-part fastener may be connected. Furthermore, and in some embodiments, the shafts of the multi-part fasteners may be integrally formed with the inserts.

The differential screw mechanism 414 shown in FIGS. 4, 5, 8 & 9 is exemplary only and can be replaced with other forms of differential screw mechanism.

Figure 14:
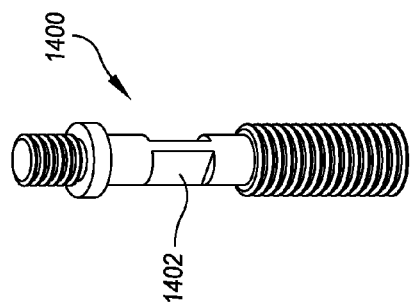
FIG. 14 illustrates an exemplary shaft of a multi-part fastener, which shaft comprises a blade portion.

The shafts 404, 818, 1204 and 1222 as shown in FIGS. 4, 5 & 8-13 are also exemplary and can be replaced with other types of shafts. For example, part of a shaft may be thinned in one or more dimensions, to allow limited deflection of the shaft in one or more directions. See, for example, the shaft 1400 shown in FIG. 14, which shall 1400 comprises a blade portion 1402. Alternately, part of the shaft may comprise an embedded spring (e.g., a helical portion) or be formed of one or more cables. The shaft may also have various cross-sections, such as a cross-section that is round, square, rectangular or hexagonal. Shaft configurations that allow for lateral deflection can be useful in compensating for slight misalignments of components, or in compensating for movements caused by thermal expansion and contraction of various components. Typically, a shaft configuration that allows for some movement perpendicular to its axis, but little or no movement along its axis, is preferred. In this manner, the planarity and compression of a microelectronic contactor assembly can be maintained.

Figure 15:
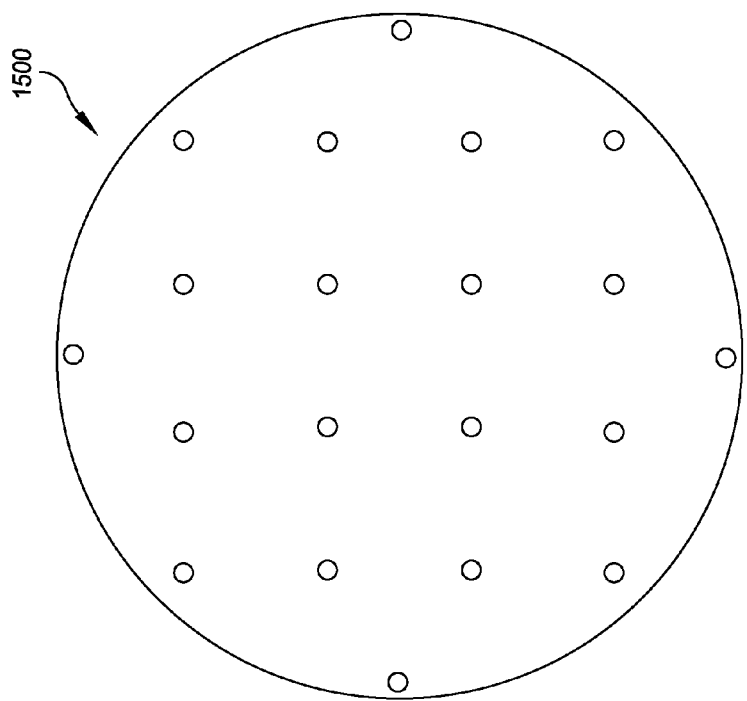
FIG. 15 illustrates a plan view of a probe head substrate comprising only hole-mounted inserts.

Although the exemplary probe head substrate 300 has a first plurality of inserts 400 anchored in holes 308, 310 and a second plurality of inserts 800 anchored in edge recesses 312, 314, some probe head substrates may comprise only hole-mounted inserts. A plan view of the hole pattern of an exemplary one of such substrates 1500 is shown in FIG. 15. Other probe head substrates may lack edge recesses, but may otherwise have clamps (such as the clamp shown in FIG. 8) clamped to the periphery of the substrate.

Figure 16:
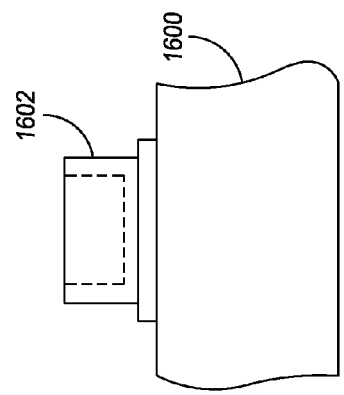
FIG. 16 illustrates a cross-section of a portion of an exemplary probe head substrate, wherein the probe head substrate has a location to which a surface-mounted threaded receptacle is attached.

Still other probe head substrates may be provided with a combination of one or more inserts and one or more surface-mounted structures, such as surface-mounted receptacles to which shafts of multi-part fasteners may be coupled, or surface-mounted shafts to which differential screw mechanisms or other multi-part fasteners may be coupled. For example, FIG. 16 illustrates a cross-section of a portion of a probe head substrate 1600, wherein the probe head substrate 1600 has a location to which a surface-mounted threaded receptacle 1602 is attached. The surface-mounted threaded receptacle 1602 may be attached to the probe head substrate 1600 by, for example, an adhesive, solder or brazing. A shaft of a multi-part fastener may then be coupled to the surface-mounted threaded receptacle 1602.

Depending on the particular form of a microelectronic contactor assembly, advantages of inserts over surface-mounted structures may include: reduction in the height of the assembly; a greater anchoring area; improved lateral stability; lift-off mitigation; and an ability to properly position and orient the inserts in a somewhat larger hole or recess.

The number of fastener components that are inserted into a space transformer can vary, as can their locations. In some embodiments, a circular probe head substrate like that shown in FIG. 3, having a 330 mm diameter, may be provided with a combination of twelve hole-mounted inserts and eight edge-mounted inserts, with each insert having an interior diameter (and each shaft having an exterior diameter) of 2-5 millimeters. However, other numbers, types and sizes of inserts and/or surface-mounted structures may be employed.

Up to this point, only one substrate of a probe head has been discussed. In some embodiments of a microelectronic contactor assembly, a probe head may comprise only a single substrate (or only a single major substrate). In these embodiments, the probe head substrate may be a multi-layer substrate, such as a multi-layer ceramic (MLC) substrate. The multi-layer substrate may have a plurality of microelectronic contactors on a first surface, and a plurality of electrical contacts on a second surface, wherein the second surface is opposite the first surface. Electrical connections formed in and through the layers may electrically connect some or all of the microelectronic contactors on the first surface to the electrical contacts on the second surface. In some cases, the microelectronic contactors on the first surface may have a different layout or pitch as compared to the layout or pitch of the electrical contacts on the second surface. In these cases, the multi-layer substrate may be referred to as a space transformer substrate. Typically, the microelectronic contactors on the first surface of the multi-layer substrate will be concentrated more densely (or in denser groups) than the electrical contacts on the second surface of the multi-layer substrate. In this manner, the microelectronic contactors can contact a dense arrangement (or multiple dense arrangements) of contacts on one or more DUTs (e.g., DUTs on a semiconductor wafer). The less dense arrangement of electrical contacts on the second surface of the multi-layer substrate enables these contacts to be contacted by larger and less-expensive contactors provided by a compressible electrical interconnect.

It is noted that a probe head having only a single major substrate need not employ an MLC substrate. For example, in some embodiments, a probe head having only a single major substrate may have employ a single layer ceramic, metallic or other rigid substrate on which layers of thin-film or thick-film dielectrics and conductors are deposited to provide space transformation of electrical contacts.

Figure 17:
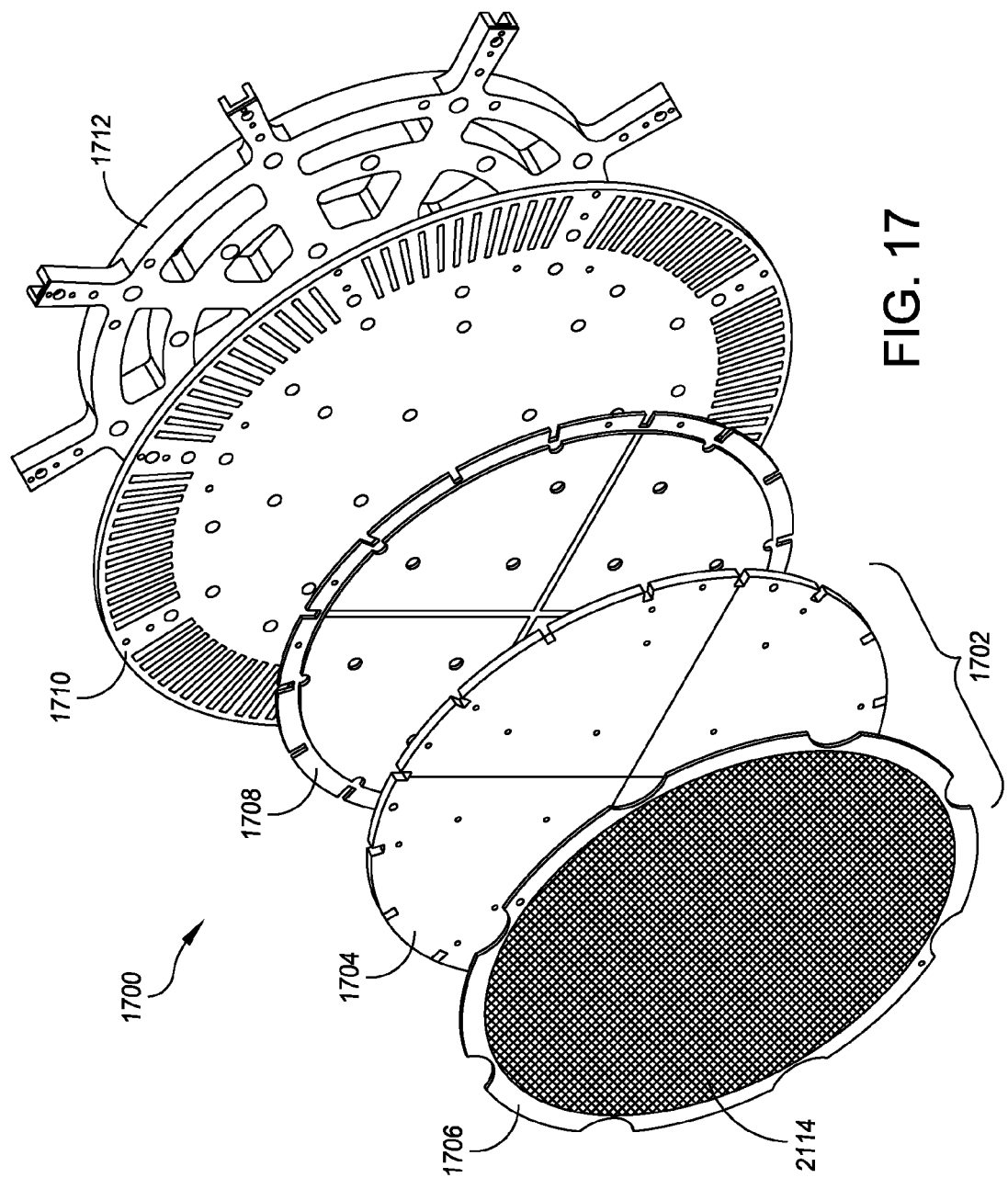
Figure 18:
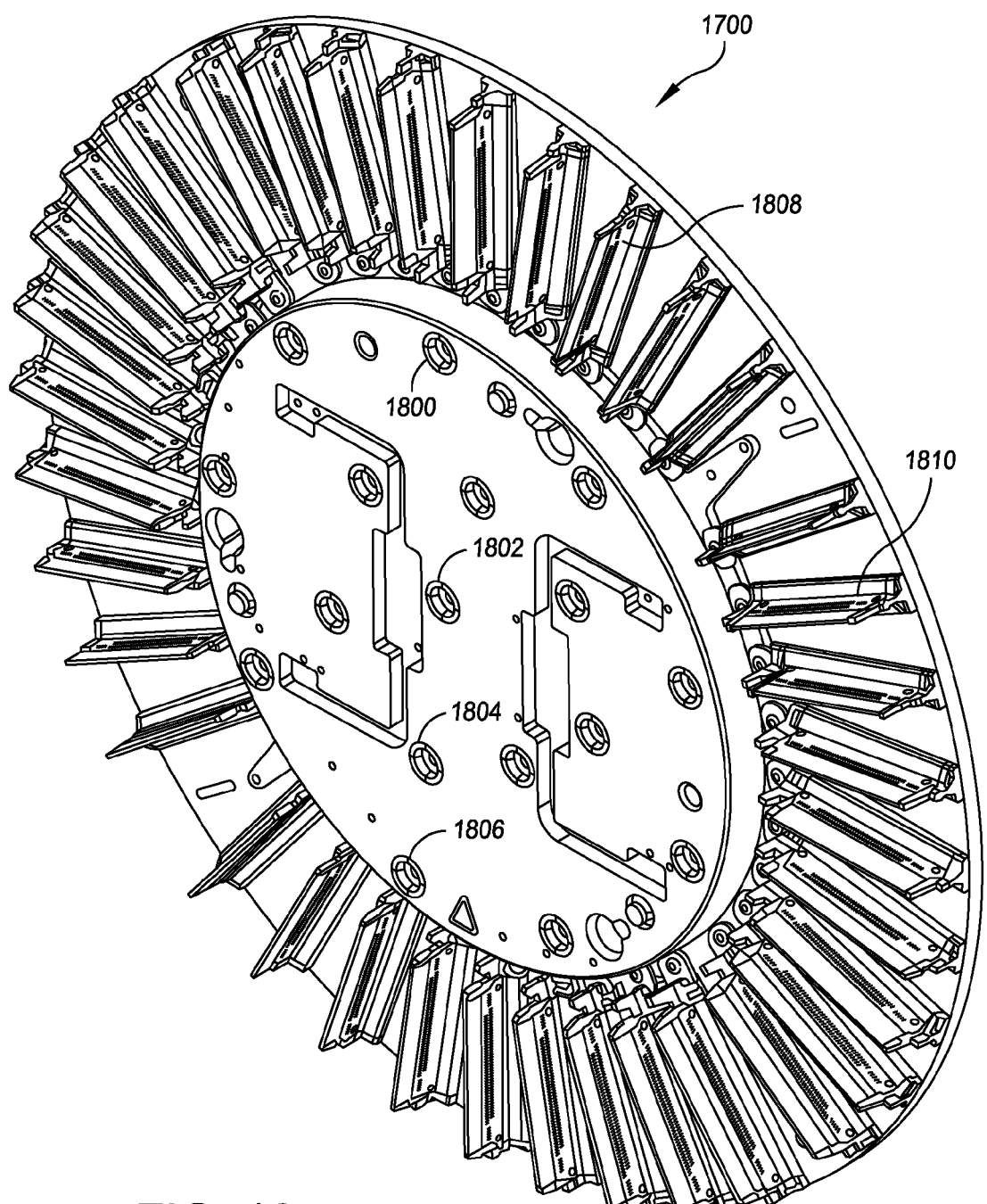

FIGS. 17-22 illustrate a microelectronic contactor assembly 1700 having a probe head 1702 with more than one major substrate—and by way of example, a probe head 1702 having a space transformer substrate 1704 and a probe contactor substrate 1706. The microelectronic contactor assembly 1700 also comprises a compressible interconnect 1708, a circuit board 1710, and a stiffener 1712. As best seen in the cross-section of the probe head 1702 shown in FIG. 21, the space transformer substrate 1704 has a first surface 2100 opposite a second surface 2102 and a space transforming electrical interconnect 2104 therebetween. The space transforming electrical interconnect 2104 includes electrical contacts 2106, 2108 on both the first surface 2100 and the second surface 2102 of the space transformer substrate 1704. The electrical contacts 2106 on the first surface 2100 of the space transformer substrate 1704 electrically connect to the compressible electrical interconnect 1708 (FIG. 17). The probe contactor substrate 1706 also has a first surface 2110 opposite a second surface 2112. The probe contactor substrate 1706 is coupled to the space transformer substrate 1704, with the first surface 2110 of the probe contactor substrate 1706 facing the second surface 2102 of the space transformer substrate 1704. A plurality of microelectronic contactors 2114 are i) coupled to the second surface 2112 of the probe contactor substrate 1706 (e.g., via electrical contacts/terminals 2116 coupled to the microelectronic contactors 2114), and electrically connected to the electrical contacts/bond pads 2108 on the second surface 2102 of the space transformer substrate 1704 (e.g., by bond wires 2118 attached to the terminals 2116 and bond pads 2108, which bond wires 2118 pass through a cavity or slot 2120 in the probe contactor substrate 1706). Various structures and methods for attaching a probe contactor substrate 1706 to a space transformer substrate 1704 are disclosed in U.S. patent application Publication U.S. 2009/0237099 A1 (the '099 publication) entitled "Probe Card Substrate with Bonded Via", assigned to Touchdown Technologies, Inc. and hereby incorporated by reference for all that it discloses. By way of example, the probe contactor substrate 1706 may be coupled to the space transformer substrate 1704 using adhesive elements 2222, 2224, 2226.

Figure 21:
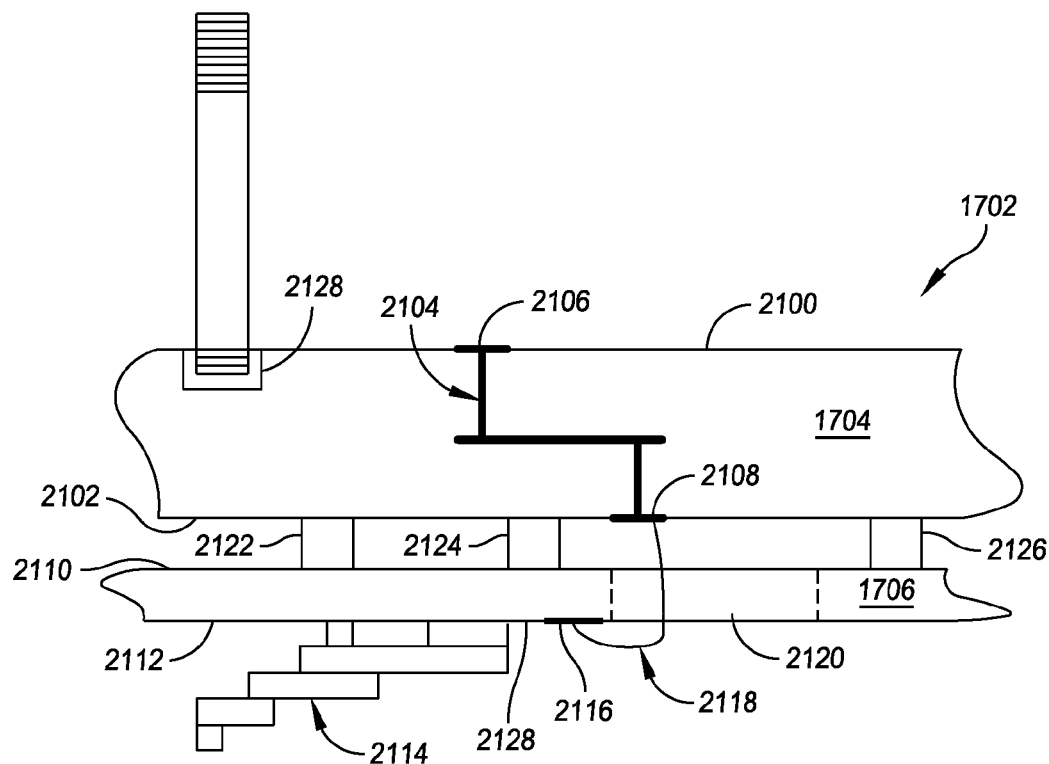
Figure 22:
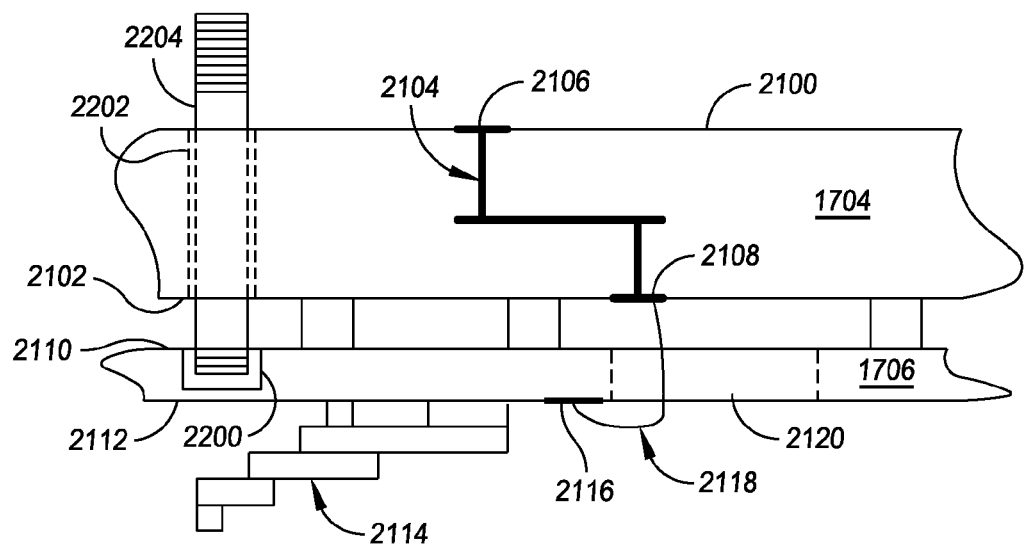
FIG. 22 illustrates an exemplary insert anchored in a substrate farthest from a stiffener.

In embodiments of a microelectronic contactor assembly having a probe head 1702 with more than one major substrate, inserts 2228 may be anchored in the substrate that is nearest the stiffener (e.g., in the space transformer substrate 1704), as shown in FIG. 22. One advantage to anchoring inserts 2228 in the space transformer substrate 1704 is that the inserts 2228 can extend into or through the space transformer substrate 1704 without interfering with microelectronic contactor placement on the probe contactor substrate 1706. For example, see FIG. 21, where an insert 2128 extends all the way through the space transformer substrate 1704, but a microelectronic contactor 2114 is positioned over (or overlaps) the insert 2128. In fact, even if an insert were to extend all the way through the space transformer substrate 1704, it would not interfere with the placement of microelectronic contactors 2114 on the probe contactor substrate 1706. In some cases, a plurality of microelectronic contactors may overlap an insert. Alternately, and as shown in FIG. 22, inserts 2200 may be anchored in the substrate that is furthest from the stiffener (e.g., the probe contactor substrate 1706), and access holes 2302 may be provided in the substrate that is nearest the stiffener (e.g., in the space transformer substrate 1704) so that multi-part fasteners coupled to the stiffener may be coupled to the more distant substrate. The multi-part fasteners may alternatively be attached to surface-mounted structures on the distant substrate (e.g., the probe contactor substrate 1812).

The inserts or surface-mounted structures may be configured similarly to any of the inserts or surface-mounted structures that may be anchored in or mounted to the substrate nearest the stiffener; and in various embodiments, the inserts 2200 or surface-mounted structures may receive shafts 2204.

Various configurations of the microelectronic contactor assembly components shown in FIGS. 17-22 will now be discussed, as well as exemplary methods of making some of the components.

The '099 publication describes various exemplary methods of making (and structures used in) a probe head 1702 (FIG. 17) having a probe contactor substrate 1706 and a space transformer substrate 1704. Because of the unique way in which the probe head 1702 (alternately referred to as a probe card assembly) is fashioned, the probe contactor substrate 1706 is not limited to materials generally used as probe contactor substrates, namely a Low Temperature Co-fired Ceramic (LTCC) or a High Temperature Co-Fired Ceramic (HTCC), ceramics with vias, or multi-layer High Density Interconnect (HDI) substrates. Because the probe contactor substrate 1706 does not require electrical vias, the substrate 1706 may be any suitable material. In some embodiments, the probe contactor substrate 1706 may be an alumina ceramic substrate. When used to test semiconductors, the probe contactor substrate should generally exhibit qualities such as: good thermal expansion matching that of silicon (because the device under test is usually silicon), good surface quality (low pitting, excellent planarity and surface roughness), good electrical properties for high frequency signal transmission through conductors built on its surface (implies the need for a low-loss dielectric substrate material), good mechanical strength and processability (ability to form holes or slots conveniently and to build wiring traces on the surface). Alumina ceramic (95%-99% alumina) is one such material, as it meets the above criteria, is inexpensive, and is readily available. However, other ceramic materials (such as alumina nitride, silicon nitride or alumina silicon nitride) may also be used, as well as glass, dielectric coated metal (for example anodized aluminum and paryline coated materials), silicon (such as an oxidized or dielectric coated silicon wafer), KAPTON® (Polyimide) flex material, or Printed Circuit Board (PCB) material.

Upon the probe contactor substrate 1706, a plurality of microelectronic contactors 2114 (typically MEMS structures) are built. See, e.g., FIG. 21. These MEMS structures may be built to withstand the stresses and environment of testing semiconductors, and in many embodiments may be lithographically formed on the probe contactor substrate 1706. In some embodiments, these structures may be torsional spring contactors, as described in U.S. Pat. No. 6,771,084 entitled "Single-Sided Compliant Probe Apparatus", U.S. Pat. No. 7,264,984 entitled "Process for Forming MEMS", U.S. Pat. No. 7,271,022 entitled "Process for Forming Microstructures", U.S. Pat. No. 7,362,119 entitled "Torsion Spring Probe Contactor Design, U.S. Pat. No. 7,245,135 entitled "Post and Tip Design for a Probe Contact", and U.S. Pat. No. 7,589,542 entitled "Hybrid Probe for Testing Semiconductor Devices", all of which are assigned to Touchdown Technologies, Inc., and the disclosures of which are hereby incorporated by reference. The microelectronic contactors may also be of the cantilever type contactor, such as those produced by Form Factor, Inc. and others. The contactors may also be inflexible type contactors (for example, see U.S. Pat. No. 6,891,360 assigned to IBM and entitled "Plated Probe Structure"), which are often used in testing bumped wafers. The contactors may be assembled to the probe contactor substrate, or they may be built directly on the probe contactor substrate, as described, for example, in U.S. Pat. Nos. 7,264,984 and 7,271,022.

When contactors 2114 are built directly on the probe contactor substrate 1706, in accordance with the above mentioned patents, they are often built using processes which involve sacrificial metal and removable photoresist. The base of a microelectronic contactor 2114 is usually connected via a metal trace 2130 to a terminal 2116 on the probe contactor substrate 1706, as can be seen in FIG. 21. This allows for the tips of the microelectronic contactors to have a finer pitch, while allowing the elements to which the probe contactors are electrically connected to have a larger pitch. It also provides an electrical path to vias or substrate terminals. Any technique commonly known in the art may be used to form the trace 2130 and the terminal 2116, including thick-film printing, thin-film deposition, etching, and plating. If the probe contactor substrate 1706 is polyimide flex (or some other flex, such as Liquid Crystal Polymer) or PCB material, then the techniques commonly used in relevant printed wiring board manufacturing may be employed, including so-called "additive" processes where traces and terminals are electroplated up on a thin laminated metal seed layer, and "subtractive" processes where a laminated metal layer is etched to produce the trace and terminal.

In some embodiments, the microelectronic contactors 2114 may be assembled to or built on a probe contactor substrate 1706 that is somewhat larger than its final size. For example, the microelectronic contactors 2114 could be assembled to or built on a probe contactor substrate 1706 having a 350 mm diameter, and the probe contactor substrate 1706 could then be cut down to a 330 mm diameter after the microelectronic contactors 2114 are assembled, or built thereon.

As also described in the '099 publication, a space transformer substrate may be formed by attaching multiple space transformer substrates (or tiles) to a single probe contactor substrate, or vice-versa, to meet the complex size and planarity requirements of advanced probe heads. In these embodiments, the tiles of one substrate may be individually attached to the other substrate, and MEMS or other structures may be formed on the individual tiles before or after they are joined to the other substrate. Alternately, the tiles may be joined to form a single space transformer substrate (or single probe contactor substrate) prior to the formation or completion of MEMS or other structures on the single larger substrate. See, for example, FIG. 23 at step 2300. Here, a plurality of LTCC tiles (four tiles 2308, 2310, 2312, 2314) are selected, lapped flat, and their bond-edges 2316, 2318, 2320, 2322, 2324, 2326, 2328, 2330 are precision-diced. In step 2302, the tiles 2308-2314 are joined using, for example, an epoxy-based adhesive. A fixture may be used to hold the tiles 2308-2314 in position as the adhesive cures. At step 2304, the joined tiles 2308-2314 may be cut to an approximate shape and size (e.g., a circular or other shape) and lapped flat once again. A larger and somewhat thicker substrate of joined tiles can be easier to handle and process. Also at step 2304, a plurality of features may be formed or completed on one or both surfaces of the joined tiles 2308-2314. The features that may be formed or completed in parallel, to provide good registration and orientation of the features. For example, in the case of a space transformer substrate 1704, the features may comprise electrical contacts 2106, 2108 (FIG. 21). In the case of a probe contactor substrate 1706, the features may comprise a plurality of microelectronic contactors 2114. By forming microelectronic contactors 2114 in parallel, across joined tiles 2308-2312, better alignment of the contactors 2114 can typically be achieved as compared to i) attaching individual ones or groups of contactors to the substrate, or ii) attaching contactors to, or building contactors on, individual ones of the tiles before the tiles are joined. In some cases, the microelectronic contactors may be formed using lithographic processes, as described, for example, in the afore-mentioned U.S. Pat. Nos. 6,771,084; 7,264,984; 7,271,022; 7,362,119, and 7,245,135.

In same embodiments of a probe contactor substrate 1706, after the microelectronic contactors 2114, 2406 are formed on the probe contactor substrate 1706, the backside 2400 of the probe contactor substrate 1706 is machined and planarized to its desired thickness. For example, in the case of a probe contactor substrate 1706 which is made from alumina, the surface 2400 of the substrate 1706 may be machined and planarized to a thickness of 6 mils-80 mils (approximately 0.15 mm-2.0 mm). To protect the microelectronic contactors 2114, 2406 during this planarization process, a sacrificial material 2402, such as copper, may be deposited around the microelectronic contactors 2114, 2406 prior to planarization. See, FIG. 21. The same (or different) sacrificial material may be used to protect the microelectronic contactors 2114, 2406 as their tips 2404, 2408 are planarized. The planarization of both the backside 2400 of the probe contactor substrate 1706, as well as the microelectronic contactor tips 2404, 2408, helps to provide optimal planarity of the probe contactor substrate 1706 and microelectronic contactors 2114, 2406. If a probe contactor substrate 1706 is to be formed of joined tiles 2308-2312 (FIG. 23), the deposition of sacrificial material 2402 and planarization processes described in this paragraph may all be performed on a probe contactor substrate 1706 formed after the tiles 2308-2312 have been joined. After planarization, the sacrificial material 2402 may be removed.

A plurality of cavities or slots 2120 may be formed in a probe contactor substrate 1706, before or after microelectronic contactors 2114 are assembled to or built on the probe contactor substrate 1706. See, e.g., FIG. 21. The '099 publication describes exemplary ways to do this. The slots 2120 allow the microelectronic contactors 2114 on the probe contactor substrate 1706 to be coupled to electrical contacts/bond pads 2108 on a surface 2102 of the space transformer substrate 1704.

In some cases, the probe contactor substrate 1706 may be cut to a desired shape and size after attaching or building the microelectronic contactors 2114 thereon. This helps to ensure good registration of the contactors with the periphery of the probe contactor substrate 1706. By way of example, the substrate may be cut to a final shape and size using a water jet cutting process 2404, 2408. The final cut may be made before or after the planarization of a probe contactor substrate and microelectronic contactor tips. See FIG. 23 at step 2306, and FIG. 24.

Of note, in many cases, the method steps described above may be performed in different orders or not at all.

The construction of an exemplary space transformer substrate 1704 (FIG. 17) will now be described. The space transformer substrate 1704 may be a printed wiring board or an interconnect substrate. The space transformer substrate 1704 may also be a ceramic wiring board such as an LTCC or HTCC board, or any multi-layer ceramic, including one whose CTE is appropriately matched to account for thermal expansion mismatch to a silicon wafer under test. Other options include organic wiring substrates, PCB substrates, flex substrates, etc. The space transformer substrate material is typically selected primarily for multi-layer wiring capability, cost, and manufacturability, without undue regard to surface finish, surface integrity or compatibility with MEMS processes. Such a material is DuPont 951, Dupont 943, or LTCC tape. Forming the space transformer substrate 1704 often involves the production of multi-layer circuits from ceramic substrate tapes or sheets. Via holes are punched in the substrates, the via holes are filled with conductive paste, and conductive, dielectric, and resistive pastes are optionally applied in wiring patterns on the surface of each sheet or tape as needed, and then the sheets are laminated-together and fired (often in a precisely controlled oven or kiln) in one step. The resulting product is a monolithic space transformer or multi-layer wiring board structure. A typical LTCC space transformer substrate consists of multiple dielectric layers; screen-printed or photo-imaged low-loss conductors; embedded inductors, resistors and capacitors; and vias for interconnecting the multiple layers. A multi-layer wiring board (which an LTCC space transformer is), may also have impedance control and crosstalk shielding measures such as strip lines and coplanar waveguides. Additionally, multiple layers may form a wiring network within the substrate connecting one bond pad to another bond pad (or multiple bond pads). The space transformer substrate 1704 may also include around planes and power planes as is known in the art. Electronic components such as capacitors, active switches or integrated circuits may be attached on either surface of the space transformer substrate 1704 or in pockets formed in the space transformer substrate 1704. Alternately, electronic components may be positioned as shown in FIGS. 32-35, which will be described later in this description. Each layer of a space transformer substrate 1704 can be inspected before lamination and firing to allow opportunity to replace damaged circuits and improve yield. Since the ceramic materials used in LTCC designs are inherently very temperature stable, the need to compensate for variations in temperature is greatly reduced.

In some embodiments, the space transformation of electrical contacts provided by the space transformer substrate 1704 may be provided in whole or in part by lagers of thin-film or thick-film conductors and dielectrics deposited on one or both surfaces of a structural support substrate (e.g., a ceramic or metallic substrate). With this kind of space transformer substrate, the structural support substrate need not provide space transformation itself, but may instead simply have a plurality of conductive vias formed therein. Of note, layers of thin-film or thick-film conductors and dielectrics can also be deposited on one or both surfaces of a probe contactor substrate, and in some cases may be used to provide a space transformation of electrical contacts.

As shown in FIG. 21, the surface 2102 of the space transformer substrate 1704 may include bond pads 2108. The bond pad 2108 may be formed directly on an electrical via that conducts the electrical signal through the space transformer substrate 1704. Alternatively, the bond pad 2108 may be formed over the space transformer's surface 2102 and connected to the via by a metal trace (not shown). The bond pads 2108 are located on the space transformer substrate 1704 in positions that align to the slots 3120 formed in the probe contactor substrate 1706. The bond pads 2120 are preferably wire bondable pads, each comprising a gold thick film material or electroplated gold. Other options include aluminum or any other conductive bondable bond pail suitable for wire bonding or conductive adhesive bonding.

Figure 23:
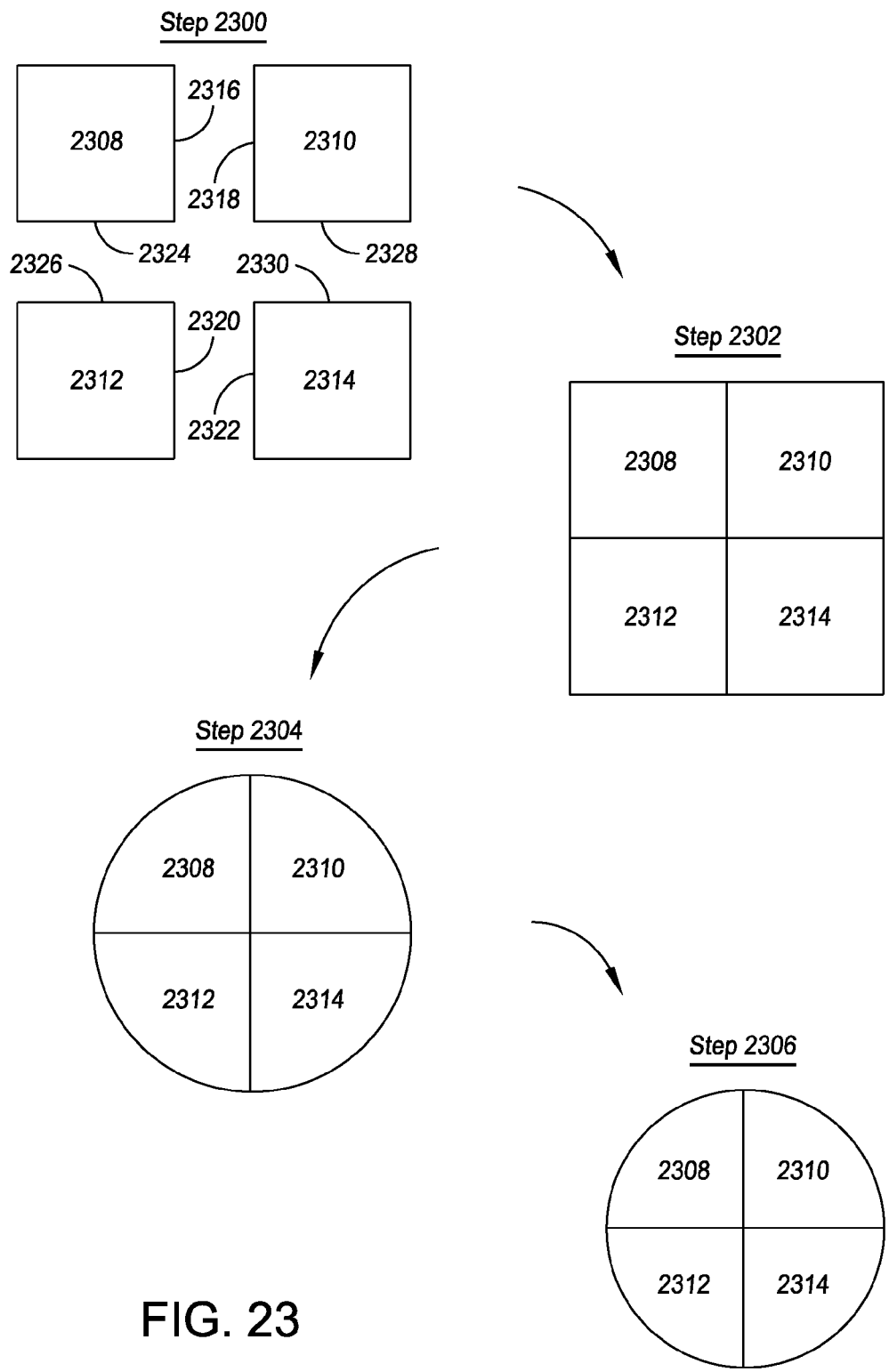
FIG. 23 illustrates how a space transformer or probe contactor substrate may be formed by attaching multiple substrate tiles.
Figure 24:
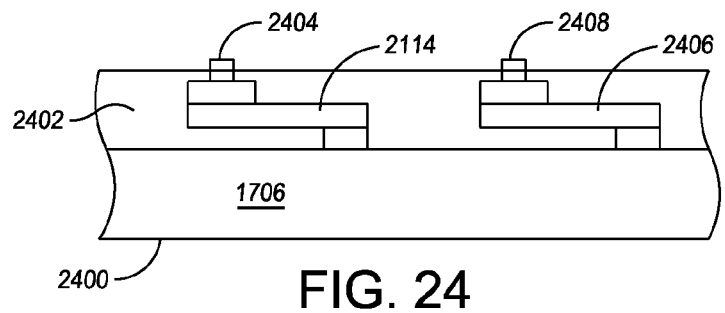
FIG. 24 illustrates how a sacrificial material may be used to protect microelectronic contactors during a planarization process.

In some embodiments, the space transformer substrate 1704 may be formed of multiple joined substrates (i.e., joined tiles 2308-2312), as described with respect to FIG. 23. Each of the tiles 2308-2312 can be a multi-layer tile. Electrical contacts (bond pads, etc.) may be formed on each tile 2308-2312 before the tiles are joined, or in parallel across all of the tiles 2308-2312 after the tiles are joined. The former tends to increase yield, while the latter tends to improve planarity and registration of the contacts.

In some cases, the space transformer substrate 1704 may be cut to a desired shape and size after forming electrical contacts thereon. This helps to ensure good registration of the electrical contacts with the periphery of the space transformer substrate 1704. By way of example, the substrate 1704 may be cut to a final shape and size using a water jet cutting process. Cutting the space transformer substrate 1704 to a desired shape and size may comprise cutting edge recesses in the periphery of the substrate 1704. Holes for receiving inserts may then be drilled or otherwise formed in the substrate 1704. The edge recesses may also be formed by drilling, or by a process other than the cutting process that is used to cut the substrate 1704 to a desired shape and size.

The space transformer substrate 1704 may also be cut to a desired shape and size, and holes and edge recesses may be formed therein, before electrical contacts are formed on one or both surfaces of the substrate 1704. In this manner, inserts may be anchored in the holes, and then the surface in which the inserts are anchored may be planarized, before electrical contacts are formed on the surface.

After anchoring the inserts or other fastener components in/to the space transformer substrate 1704, the probe contactor substrate 1706 may be coupled to the space transformer substrate 1704. The two substrates 1704, 1706 may be attached in a variety of ways. In some embodiments, the two substrates 1704, 1706 may be attached via adhesive 2122, 2124, 2126 or solder. See, e.g., FIG. 21.

In some embodiments, the materials of the probe contactor substrate 1706 and space transformer substrate 1704 may be chosen to have similar (or matched) coefficients of thermal expansion (CTEs). However, the materials of the probe contactor substrate 1706 and the space transformer substrate 1704 may differ, and a CTE mismatch of some kind may exist. For example, the material of the probe contactor substrate 1706 may be selected because it has a CTE that is close (or matched) to that of a semiconductor wafer, but the material of a space transformer substrate 1704 may be selected because it is well-suited to forming the multi-layer structure of the space transformer substrate 1704. However, because of the different materials used to construct the probe contactor substrate 1706 and the space transformer substrate 1704, the CTEs of the substrates 1704, 1706 may differ. To account for these different CTEs it can be desirable to couple the probe contactor substrate 1700 to the space transformer substrate 1704 such that the two substrates 1704, 1706 can expand and contract differently. This can be accommodated, for example, by: the type of adhesive used; the manner in which the adhesive is applied; the manner in which the adhesive is cured; and combinations thereof. In some cases, a compliant adhesive may be chosen with suitable modulus to account for the thermal mismatch between the space transformer substrate and probe contactor substrate. Some suitable options for such a compliant adhesive are adhesive polymers such as silicone, elastomers, polyimides, and BCB (benzo-cyclo-butene). Alternately, hard materials, such as solder, may be used, provided the CTE mismatch is sufficiently small. Thermally compliant mechanical attachments between the space transformer substrate and the probe contactor substrate, such as screws and clips, are also possible. If adhesive is used, it can be dispensed in place, screen printed, or applied by any other means commonly known in the art. B-stage preform may also be used. If solder is used, it may be screen printed as a paste, applied as a preform, or deposited (evaporated or electroplated) prior to reflow (melting to attach the space transformer substrate and the probe contactor substrate). If adhesives are used, the elastic modulus of the adhesive, the dispense pattern and coverage area, and the adhesive bond line thickness can be engineered to absorb any thermal expansion mismatch between the space transformer substrate and the probe contactor substrate. Without such expansion absorption, the probe head could have a thermally sensitive curvature. This thermal mismatch curvature effect must be considered regardless of the attachment method used.

In some embodiments, the probe contactor substrate 1706 may be bonded to the space transformer substrate 1704 by one or more adhesive elements 2122, 2124, 2126 that cover only part of the coupled/bonded surfaces of the substrates 1704, 1706. See, FIG. 21. However, enough adhesive is needed to ensure that the probe contactor substrate 1706 and space transformer substrate 1704 remain substantially planar. This may be accomplished, in some cases, by applying an epoxy-based thermosetting adhesive to one or both of the probe contactor substrate 1706 and the space transformer substrate 1704, but covering only a small portion of the total surface area between the probe contactor substrate and the space transformer substrate. The sparse coverage can be achieved by 1) applying the adhesive to the probe contactor substrate 1706 or space transformer substrate 1704 in small droplets, and 2) applying a few droplets of adhesive per square centimeter. More, fewer or different types of adhesive elements may be used, but the above application typically translates to a few droplets per semiconductor die when a probe head is used to test a semiconductor wafer. Regardless of how the adhesive is applied, it may be partially cured, and then planarized to a uniform height (e.g., by diamond flycutting), before the probe contactor substrate 1706 and space transformer substrate 1704 are joined. If individual adhesive elements (e.g., dots or lines) are applied to a surface, the adhesive elements may be protected during the planarization process using a sacrificial material. After positioning the probe contactor substrate 1706 and space transformer substrate 1704 adjacent one another, with the adhesive 2122, 2124, 2126 in contact with both substrates 1704, 1706, the adhesive 2122, 2124, 2126 may be cured by heating the adhesive to a temperature above the intended use temperature of the probe head 1702, but not much higher, so as to avoid distorting the planarity of the adhesive 2122, 2124, 2126. The cure temperature and cure time will typically be adhesive and application dependent. In some cases, the adhesive 2122, 2124, 2126 may be chosen and cured such that it remains compliant at one or more expected operating temperatures of a probe head 1702 or microelectronic contactor assembly 1700.

Spacers (not shown) may be formed between the probe contactor substrate 1706 and the space transformer substrate 1704. These spacers can be used to accurately control the adhesive bond line or droplet thickness if adhesive is used to couple the substrates 1704, 1706. By way of example, the spacers may be electroplated on a surface of the space transformer substrate 1704. The spacers may take the form of MEMS posts, walls or other features, and in some cases may be formed of Nickel. Alternately, the spacers may be formed using thin-film or other processing methods. Once attached to the space transformer substrate 1704, the spacers can be machined so that their top surfaces lie in a plane. The machining may be accomplished, for example, by supporting the spacers with a sacrificial material, and then planarizing the tips of the spacers using a diamond flycutting process. The machining operation guarantees that the probe contactor substrate 1706 has a planar array of adhesive surfaces to bond against, thus ensuring that the tips of the microelectronic contactors 2114 lie in a plane even when the surface of the space transformer substrate 1704 is imperfect and not flat.

Alternately, the spacers can be applied to a surface of the probe contactor substrate 1706.

When spacers are used to define the stand-off between the probe contactor substrate 1706 and the space transformer substrate 1704, CTE mismatch between the probe contactor substrate 1706 and the space transformer substrate 1704 may be further accommodated by bonding the two substrates 1704, 1706 only at or near their centers. The bonding may be provided by an adhesive, which adhesive may be compliant or rigid when cured. Alternately, the bonding may be provided by solder or other materials. For purposes of this description, "near their centers" is defined as the region extending from the center to approximately 20% of radius, the extent of which is determined by the CTE mismatch of the substrates 1704, 1706 and their allowed deformation.

After coupling the probe contactor substrate 1706 to the space transformer substrate 1704, the microelectronic contactors 2114 may be electrically coupled to electrical contacts (e.g., bond pads 2108) on the space transformer substrate 1704 using various bond interconnects, as disclosed, for example, in the '099 publication. The bond interconnects may include gold wires 2118, conductive adhesive, solder paste or other bond interconnects. In some cases, the bond interconnects may be coupled to terminals 2116 on the probe contactor substrate 1706, which terminals 2116 are electrically coupled to the microelectronic contactors 2114.

Figure 25:
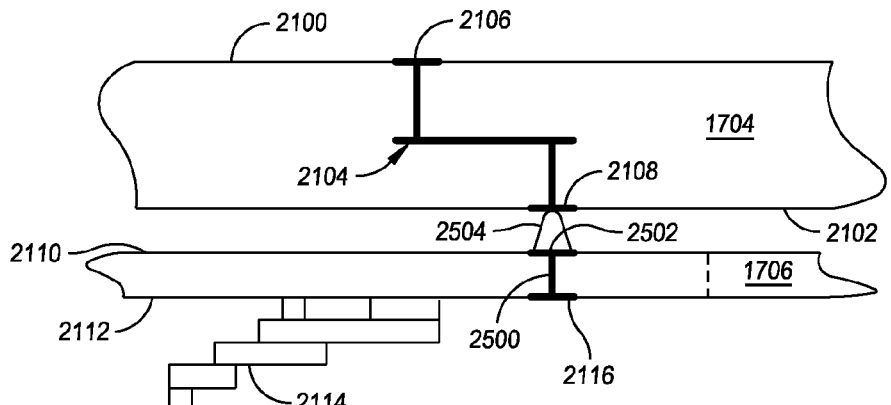
FIG. 25 illustrates an exemplary probe contactor substrate comprising conductive vias that couple the microelectronic contactors on one surface of the probe contactor substrate to electrical contacts on the other surface of the probe contactor substrate.

In alternate probe head embodiments, and as shown in FIG. 25, the probe contactor substrate 1706 may comprise conductive vias 2500 that couple the microelectronic contactors 2114 (or bond pads 2116 that are coupled to the microelectronic contactors 2114) on one surface 2112 of the probe contactor substrate 1706 to electrical contacts 2502 on the other surface 2110 of the probe contactor substrate 1706. In these embodiments, solder bumps 2504 or other three-dimensional electrical contacts may be provided on a surface 2110 of the probe contactor substrate 1706 or the space transformer substrate 1704, and the solder bumps 2504 or other three-dimensional electrical contacts may be used to electrically connect the microelectronic contactors 2114 to the electrical interconnect 2104-2108 of the space transformer substrate 1704. Reflow of the solder bumps 2504 may also be used as the attachment mechanism between the probe contactor substrate 1706 and the space transformer substrate 1704.

Figure 26:
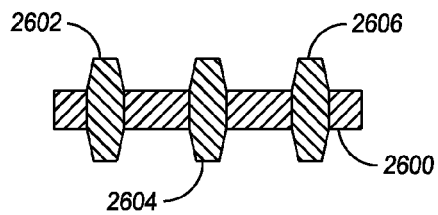
FIG. 26 illustrates an exemplary interposer comprising a silicone elastomer material in which conductive particles or structures, such as gold particles or structures, are embedded.
Figure 27:
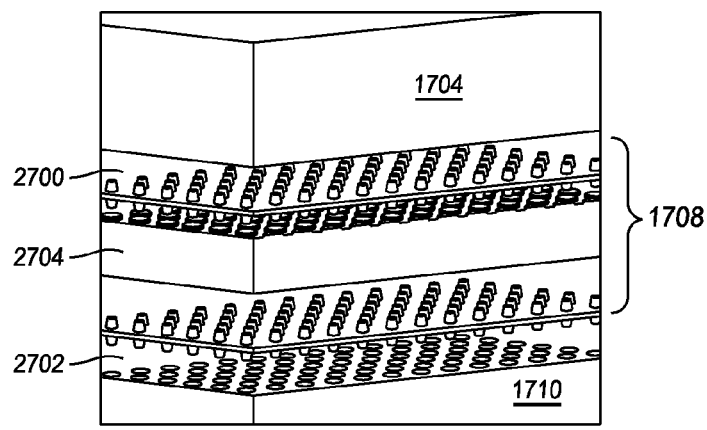
FIG. 27 illustrates an exemplary interposer, comprising two silicone elastomer sheets separated by a rigid spacer substrate.

Configurations of exemplary compressible electrical interconnect 1708 (FIG. 17) will now be described. Compressible electrical interconnect 1708 is often wholly or partly embodied in an electrical "interposer". Such an interposer may take various forms, but in general may comprise a substrate having compressible electrical interconnects projecting from either or both (and often both) of its surfaces. In some embodiments, an interposer may comprise a rigid substrate having holes in which spring interconnects are embedded. The spring interconnects may be for example, spring interconnects offered by Form Factor, Inc. under the trademark MICROSPRING® or spring pins offered by Everett Charles Corp. under the trademark POGO®. By way of example, the rigid substrate may be a ceramic, plastic, glass, dielectric coated silicon, or dielectric coated metal substrate. In other embodiments, an interposer may comprise a rigid substrate having shaped wire bonds extending from each of its surfaces. In some cases, the shaped wire bonds may have "S" or serpentine shapes. In still other embodiments, an interposer may comprise a silicone elastomer material 2600 in which an array of conductive particles or structures 2602, 2604, 2606, such as gold particles or structures, are embedded. See, FIG. 26. In some cases, two such silicone elastomer sheets 2700, 2702 may be separated by a rigid spacer substrate 2704. See, FIG. 27. In yet other embodiments, an interposer may comprise a silicone elastomer with etched compliant contactors embedded therein. Embodiments of such an interposer are described in U.S. patent application Publication U.S. 2007/0075717 A1 (the '717 publication) assigned to Touchdown Technologies. Inc., which publication is hereby incorporated by reference for all that it discloses. In some cases an interposer may be formed of multiple modules, which modules may be individually positioned between a probe head 1702 and circuit board 1710, or collectively held in place by a common supporting substrate. Such an interposer is disclosed in the '717 publication.

In some cases, some or all of the compressible electrical interconnect 1708 may take the form of compressible electrical interconnect projecting from one or both of the probe head 1702 or the circuit board 1710. If the compressible electrical interconnect 1708 is provided on both the probe head 1702 and the circuit board 1710, a substrate may be provided between the probe head 1702 and circuit board 1710 for the compressible electrical interconnect to bear against. It is preferred, however, that the compressible electrical interconnect 1708 be provided by an interposer.

The circuit board 1710 (FIGS. 17-20) may be formed of various materials, but is preferably formed of printed circuit board (PCB) materials. A plurality of electrical connectors 1808, 1810, shown as paddle board connectors in FIG. 18, may be coupled to the circuit board 1710 for routing signals between the microelectronic contactor assembly 1700 and test equipment such as an ATE system.

The stiffener 1712 (FIGS. 17-20) may be formed using metal, metal alloys or composites, and in some embodiments may be formed of stainless steel, Other than providing structural support for the microelectronic contactor assembly 1700, and having receptacles in which differential screw components 1800, 1802, 1804, 1806 may be mounted, the precise configuration of the stiffener 1712 is not important for purposes of this disclosure.

The perimeters of the stiffener 1712, compressible electrical interconnect 1708 and substrates 1704, 1706, 1710 shown in FIGS. 2 & 17-19 are shown to be circular, or generally circular. However, their perimeters could alternately be square or rectangular, and in some cases, the perimeter of one component could have a shape that differs from the shape of the perimeter of another component.

Microelectronic contactor assemblies often require the placement of electronic components in close proximity to their microelectronic contactors. In many cases, these electronic components take the form of capacitors and resistors. It can be desirable to place capacitors in close proximity to microelectronic contactors for the purposes of, for example, improving signal integrity, enabling high frequency testing, or reducing crosstalk between signal paths. It can also be desirable to place resistors in close proximity to microelectronic contactors for the purposes of, for example, enabling resource sharing between different microelectronic contactors (and consequently, resoure sharing between the DUTs or DUT contacts to which the microelectronic contactors are connected). The placement of electronic components in close proximity to microelectronic contactors can be particularly important in some semiconductor wafer test applications, such as in dynamic random access memory (DRAM) wafer test applications.

There are many factors which complicate the placement of electronic components in close proximity to microelectronic contactors. For example, if electronic components are positioned on the same surface as the microelectronic contactors, the standoff of the electronic components may require an increase in the standoff of the microelectronic contactors, thereby increasing their electrical length, reducing their mechanical stability, and generally decreasing their signal integrity performance.

FIGS. 28-31 illustrate various exemplary ways of mounting surface-mount technology (SMT) electronic components to a multi-substrate probe head, such as a probe head 1702 having a space transformer substrate 1704 and a probe contactor substrate 1706 (FIG. 17). In each of the cases shown in FIGS. 28-31, the SMT electronic component is positioned at least partially within a cavity in the probe contactor substrate. For purposes of this description, a "cavity" in a probe contactor substrate is defined as a hole or surface recess in the probe contactor substrate, which hole or surface recess is bounded at least partly by one or more interior edges of the probe contactor substrate, and which hole or surface recess is also bounded by the plane(s) of one or both surfaces of the probe contactor substrate.

The SMT electronic components may in some cases be "off-the-shell" SMT electronic components, which components can be selected for their known performance characteristics. Often, SMT electronic components provide much better performance characteristics than, for example, electronic components that are specially formed (or embedded) within a layer or layers of a space transformer or probe contactor substrate. Furthermore, the use of SMT electronic components, and the placement of same in cavities that are accessible from an exterior surface of a probe head, makes their repair or replacement much easier (especially when compared to the repair or replacement of embedded components, which embedded components often cannot be repaired or replaced).

Figure 28:
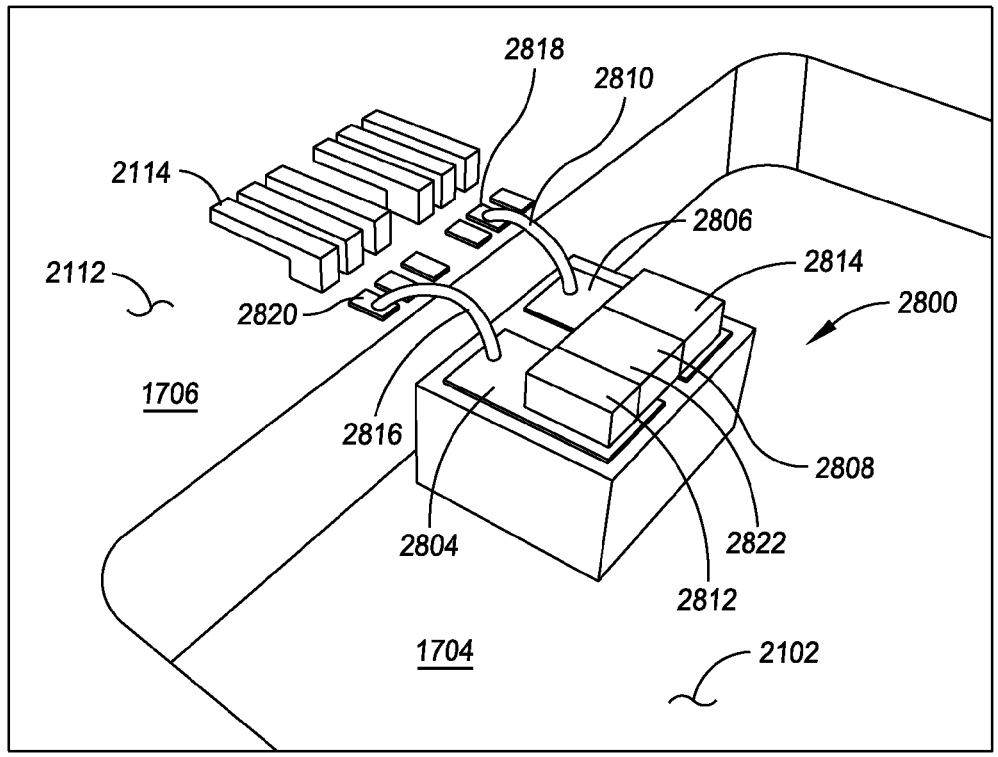
FIGS. 28-31 illustrate the mounting of various SMT electronic components in various types of cavities in a probe contactor substrate.

In FIG. 28, a pedestal substrate 2802 is metalized with as pair of bond pads 2804, 2806, such as under bump metallization (UBM) bond pads. The bond pads should be suitable for electrically coupling an SMT electronic component 2808 and electrical interconnects 2810, 2816 thereto. The terminals 2812, 2814 of the SMT electronic component 2808 are electrically coupled (e.g., soldered using a solder reflow technique) to the pads 2804, 2806, and the pedestal substrate 2802 with attached SMT electronic component 2808 is mounted to the space transformer substrate 1704 through a cavity 2800 in the probe contactor substrate 1706. The pads 2804, 2806 to which the SMT electronic component 2808 is electrically connected are then electrically connected to pads or features (collectively referred to as "conductive elements" 2818, 2820) on the surface 2812 of the probe contactor substrate 1706. The electrical connections between the pads 2804, 2806 on the pedestal substrate 2802 and the pads or features 2818, 2820 on the probe contactor substrate 1706 may be made, for example, via electrical interconnects 2810, 2816 such as wire bonds, tape automated bonding (TAB) bonds, solder, or conductive epoxy. Of note, there is no need for the electrical interconnect 2810, 2816 between the SMT electronic component 2808 and the conductive element 2818, 2820 on the surface 2112 of the probe contactor substrate 1706 to be routed on or through the probe contactor or space transformer substrates 1706, 1704.

When the depth of the cavity 2800 is greater than the height of the SMT electronic component 2808, the pedestal substrate 2802 serves to increase the standoff of the SMT electronic component 2808 from the surface 2102 of the space transformer substrate 1704. This enables placement of the SMT electronic component 2808 such that its surface 2822 that is farthest from the space transformer substrate 1704 is flush with the microelectronic contactor surface 2112 of the probe contactor substrate 1706. In this way, the SMT electronic component 2808 can be placed very close to the pads or features 2818, 2820 to which it will be electrically connected, without requiring modification of the height/standoff of the microelectronic contactors 2114. Alternately, the SMT electronic component 2808 ma be positioned such that it rises above (or sits below) the surface 2112 of the probe contactor substrate 1706. However, the SMT electronic component 2808 should not rise so far out of the cavity 2800 that it interferes with movement of the microelectronic contactors 2114.

A variety of techniques are known for mounting an SMT electronic component 2808 to a pair of bond pads 2804, 2806. Such techniques may use conductive solder paste, for example, to bond the SMT electronic component 2808 to the bond pads 2804, 2806. In some cases, a plurality of SMT electronic components may be mounted to their respective bond pads in parallel, on a common substrate. Then, individual ones (or sets) of the SMT electronic components can be singulated (or separated) from the common substrate, such that each component or set of components is provided with a pedestal substrate. By way of example, the pedestal substrate may be a ceramic substrate, an insulated metal substrate, or a printed circuit board substrate.

The pedestal substrate 2802 with attached SMT electronic component 2808 may be placed in the cavity 2800 using a standard die-attach, pick-n-place tool. The pedestal substrate 2802 may be mechanically coupled to the space transformer substrate 1704 by, for example, an adhesive (e.g., an epoxy-based adhesive) or solder. In some cases, the standoff of the electronic component 2808 with respect to the space transformer substrate 1704 or the probe contactor substrate 1706 may be ensured by, for example, holding the pedestal substrate 2802 in a desired position with respect to the space transformer or probe contactor substrate 1704, 1706 as the pedestal substrate 2802 is mechanically coupled to the space transformer substrate 1704 (e.g., as an adhesive is cured), or by holding the electronic component 2808 in a desired position with respect to the pedestal substrate as the electronic component is electrically and mechanically coupled to the bond pads 2804, 2806.

The SMT electronic component 2808 may be coupled to the pedestal substrate 2802 before or after the pedestal substrate 2802 is coupled to the space transformer substrate 1704.

Figure 29:
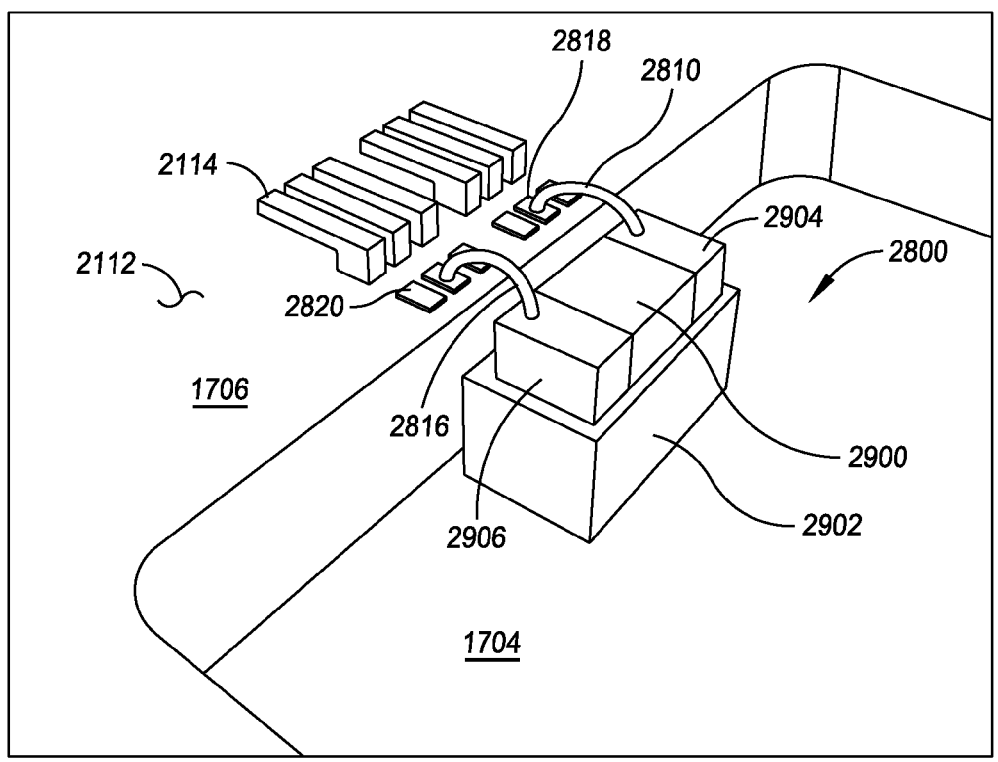

FIG. 29 illustrates an SMT electronic component 2900 that is mechanically coupled to a pedestal substrate 1704 without the use of bond pads (or with much smaller bond pads). In some cases, the SMT electronic component 2900 may be mechanically coupled to the pedestral substrate 2902 without bond pads, using an adhesive such as an epoxy-based adhesive.

The pedestal substrate 2902 with attached SMT electronic component 2900 is mounted to the space transformer substrate 1704 through a cavity 2800 in the probe contactor substrate 1706. The terminals 2904, 2906 of the SMT electronic component 2900 are then electrically connected to pads or features 2818, 2820 on the surface 2112 of the probe contactor substrate 1706. The electrical connections between the terminals 2904, 2906 of the SMT electronic component 2900 and the pads or features 2818, 2820 on the probe contactor substrate 1706 may be made, for example, via electrical interconnects 2810, 2816 such as wire bonds, TAB bonds, solder, or conductive epoxy.

The SMT electronic component 2900 shown in FIG. 29 may be positioned with respect to the surface 2102 of the space transformer substrate 1704 or the surface 2112 of the probe contactor substrate 1706 by, for example, using any of the techniques that were described in the context of FIG. 28.

In some cases, a plurality of SMT electronic components may be mounted on a common substrate. Then, individual ones or sets of the SMT electronic components may be cut from the common substrate, such that the electronic component or small sets thereof are carried on pedestal substrates.

Figure 30:
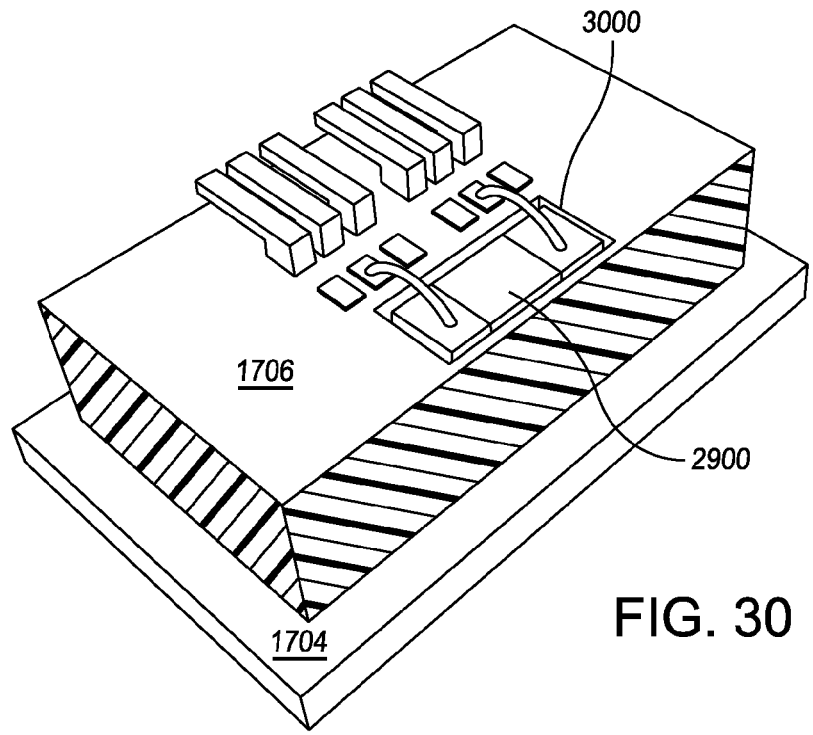

As suggested by FIGS. 28 & 29, the cavities in which pedestal substrates and SMT electronic components are placed may have "x" and/or "y" dimensions that are substantially greater than the "x" and "y" dimensions of the pedestal substrates and SMT electronic components placed therein. In some cases, microelectronic contactors on a probe contactor substrate may be coupled to bond pads on a space transformer substrate via electrical interconnects that extend into the same cavity in which a pedestal substrate is placed (see, e.g., the wirebond connections 2118 shown in FIG. 21; a pedestal substrate and SMT electronic component could also be positioned within the cavity or slot 2120). In the same or other cases, multiple pedestal substrates, or pedestal substrates carrying multiple SMT electronic components, may be placed in a single cavity. In still other cases, and as shown in FIG. 30, the "x" and "y" dimensions of a cavity 3000 may be sized only slightly larger than the "x" and "y" dimensions of a pedestal substrate or SMT electronic component 2900 placed therein. Such close tolerance cavities can minimize the surface area that an SMT electronic component 2900 monopolizes on a probe contactor substrate 1706.

The placement of an SMT electronic component in a cavity cannot only help position the component closer to one or more microelectronic contactors, but it can also provide mechanical protection for the component—especially if the cavity is sized only slightly larger than the component.

Figure 31:
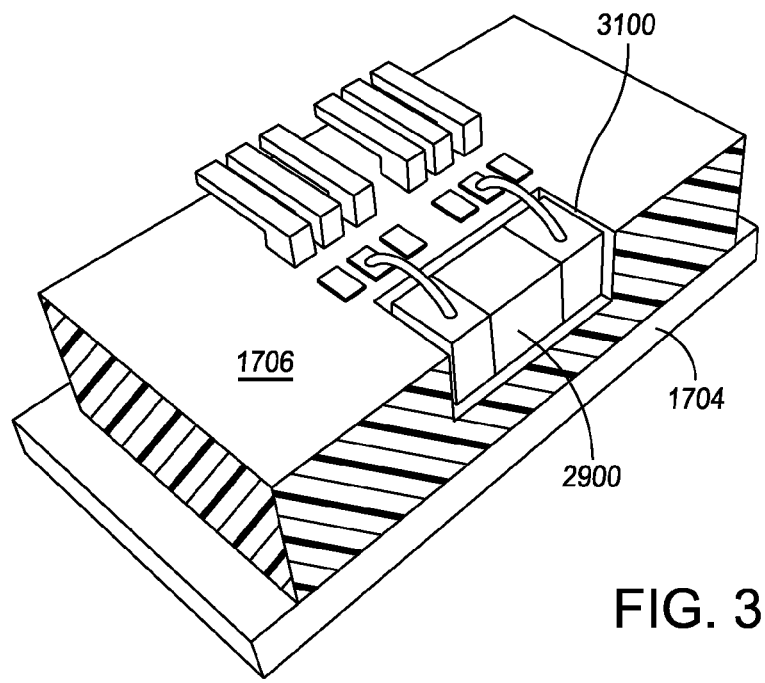
Figure 35:
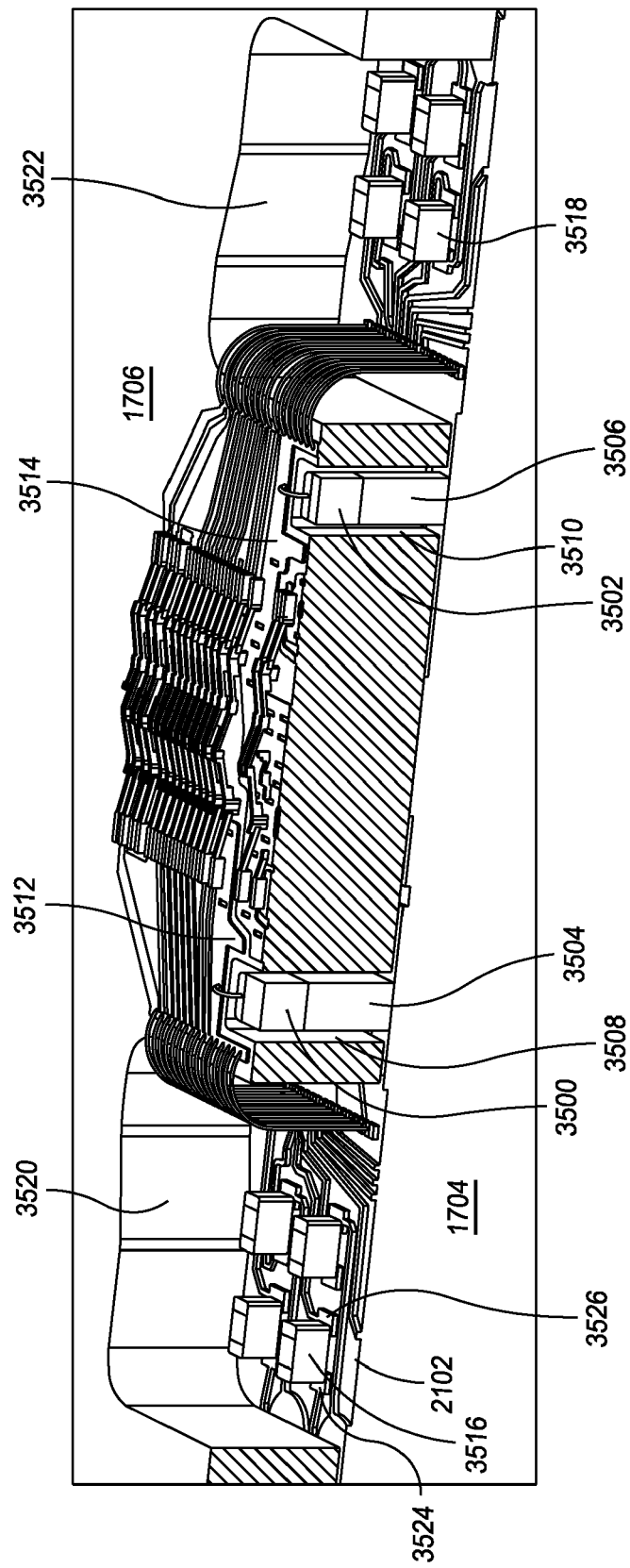
FIG. 35 illustrates an exemplary probe head cross-section and the exemplary positions of bypass capacitors and isolation resistors on same.

FIGS. 28 & 29 show pedestal substrates that have been placed in through-hole cavities in a probe contactor substrate. As shown in FIG. 31, a non-through-hole cavity 3100 may also be formed in a probe contactor substrate 1706, and an SMT electronic component 2900 may be placed therein. Alternately (not shown), an SMT electronic component may be placed in a non-through-hole cavity along with a pedestal substrate.

When an SMT electronic component is placed in a cavity that is sized only slightly larger than the component, the component can sometimes be electrically coupled to pads or other features on the probe contactor substrate without first mechanically coupling the component to the pedestal substrate, or without mechanically coupling the pedestal substrate to the space transformer substrate. The electrical interconnects that are used to electrically couple the component to the pads or features on the probe contactor substrate may then serve as the means for mechanically retaining the component in the cavity.

Each of the probe contactor substrate cavities shown in FIGS. 28-31 may be formed, for example, using methods such as mechanical machining (e.g., mechanical milling), ultrasonic machining (e.g., ultrasonic milling), laser-assisted machining, laser ablation, or wet-etching.

An SMT electronic component can also be mounted directly to the space transformer substrate, as shown, for example, in any of FIGS. 32-34. In some cases, the component 3200 may be mounted to the space transformer substrate 1704 such that it is aligned with (or accessible from) a cavity 3202 in the probe contactor substrate 1706. See, FIG. 32. Alternately, a component 3300 may be positioned partly or wholly between the probe contactor substrate 1706 and the space transformer substrate 1704. See, FIG. 33. By positioning SMT electronic components 3300, 3302 between the probe contactor substrate 1706 and the space transformer substrate 1704, the number or sizes of cavities in the surface 2112 of the probe contactor substrate 1706 can sometimes be reduced, thereby providing less interference with the placement of the microelectronic contactors 2114 on the probe contactor substrate 1706, or allowing a denser placement of microelectronic contactors 2114 on the probe contactor substrate 1706. If the size of an SMT electronic component 3400 (FIG. 34) is such that it does not fit between the probe contactor substrate 1706 and the space transformer substrate 1704, a cavity 3402 or 3404 may be formed in the surface of the probe contactor substrate 1706 that faces the space transformer substrate 1704. In this case, the SMT electronic component 3400 may extend at least partially into the cavity 3404.

In each of FIGS. 32-34, the SMT electronic component 3200, 3300, 3400 may be electrically connected to bond pads, traces or other features (collectively referred to as "conductive elements") on the surface of the space transformer substrate. The connections may be made by various types of electrical interconnects, but are often best made using solder (e.g., by means of a solder reflow technique).

Of note, all of the above techniques for positioning, mounting and electrically connecting an SMT electronic component, or a pedestal substrate, to another substrate can be performed using low temperature assembly and interconnect processes.

Any type of SMT electronic component may be positioned in any of the locations disclosed in FIGS. 28-34, or in other locations. In some cases, such as in semiconductor wafer test applications, all of the electronic components that one would like to position electrically close to a probe head's microelectronic contactors may not fit within cavities in a probe contactor substrate (or in individual component cavities), or it may not be feasible or necessary to place all electronic components on pedestal substrates so as to position them as close as possible to the pads or features to which they need to be electrically connected. In these cases, a combination of component mounting techniques and positions may be used. For example, and as shown in the probe head cross-section of FIG. 35, it may be desirable to place bypass capacitors 3500, 3502 on pedestals 3504, 3506 in cavities 3508, 3510, so that the capacitors 3500, 3502 are very close to the pads or features 3512, 3514 to which they will be connected; but it may be "good enough" to mount isolation resistors 3516, 3518 directly on the space transformer substrate 1704 (either aligned with a cavity 3520, 3522, or perhaps between the probe contactor and space transformer substrates 1704, 1706). For example, the isolation resistor 3516 is mounted on the surface 2102 of the space transformer by means of solder that electrically connects the isolation resistor to the bond pads 3524, 3526.

The above techniques for positioning, mounting or electrically connecting SMT electronic components can provide various advantages, some of which have already been mentioned. For example, by mounting SMT resistors on the space transformer substrate, the SMT resistors can be mounted on the space transformer substrate while microelectronic contactors are built on or assembled to the probe contactor substrate (i.e., the processes may proceed in parallel). By positioning or mounting all SMT electronic components below the microelectronic contactor surface of the probe contactor substrate (or at least partly within cavities in the probe contactor substrate), the positioning/mounting of the SMT electronic components does not interfere with the design of microelectronic contactors, and there is no limitation on the standoff/height of the microelectronic contactors. That is, the standoff/height of the microelectronic contactors can be very short, and there is no need to increase the standoff/height of the microelectronic contactors to ensure that their standoff/height is greater than that of the SMT electronic components. Microelectronic contactors having short standoffs/heights and overall shorter electrical lengths tend to have lower inductance, which improves power delivery through the microelectronic contactors.

By providing through-hole-cavities in the probe contactor substrate for non-through-hole cavities in the surface of the probe contactor substrate that faces the space transformer substrate), or in cases where sufficient clearance exists between the probe contactor substrate and the space transformer substrate, SMT electronic components can be mounted to the surface of the space transformer substrate facing the probe contactor substrate. In this manner, the SMT electronic components can be mounted closer to microelectronic contactors, and better performance can be achieved, than when the SMT electronic components are relegated to mounting locations on the opposite surface of the space transformer substrate.

Having described various embodiments of a microelectronic contactor assembly, the following claims are presented.

What is claimed is:

1. A probe head for a microelectronic contactor assembly, the probe head comprising:
   a space transformer substrate having a first surface opposite a second surface and a space transforming, electrical interconnect therebetween, the space transforming electrical interconnect including electrical contacts on both the first surface and the second surface of the space transformer substrate;
   a probe contactor substrate having a first surface opposite a second surface, the probe contactor substrate having a cavity therein, the probe contactor substrate coupled to the space transformer substrate with the first surface of the probe contactor substrate facing the second surface of the space transformer substrate, the second surface of the probe contactor substrate having a plurality of microelectronic contactors thereon that are electrically connected to the electrical contacts on the second surface of the space transformer substrate; and
   a surface mount technology (SMT) electronic component positioned at least partially in the cavity.

2. The probe head of claim 1, wherein the cavity is a through-hole cavity and the SMT electronic component is mounted on the second surface of the space transformer substrate.

3. The probe head of claim 1, further comprising a pedestal substrate, wherein the cavity is a through-hole cavity, the SMT electronic component is positioned on the pedestal substrate, and the pedestal substrate is positioned on the second surface of the space transformer substrate.

4. The probe head of claim 3, further comprising an adhesive between the pedestal substrate and the second surface of the space transformer substrate.

5. The probe head of claim 3, further comprising an adhesive between the SMT electronic component and the pedestal substrate.

6. The probe head of claim 3, further comprising an electrical interconnect between a terminal of the SMT electronic component and a conductive element on the second surface of the probe contactor substrate.

7. The probe head of claim 6, wherein the electrical interconnect comprises a wire bond between the terminal of the SMT electronic component and the conductive element on the second surface of the probe contactor substrate.

8. The probe head of claim 6, wherein the electrical interconnect comprises a tape automated bonding (TAB) bond between the terminal of the SMT electronic component and the conductive element on the second surface of the probe contactor substrate.

9. The probe head of claim 3, further comprising:
   a bond pad on the pedestal substrate; and
   an electrical interconnect between the bond pad and a conductive element on the second surface of the probe contactor substrate;
   wherein the SMT electronic component is electrically coupled to the bond pad.

10. The probe head of claim 3, wherein the pedestal substrate is a ceramic substrate.

11. The probe head of claim 3, wherein the SMT electronic component is an SMT capacitor, the probe head further comprising:
    a first conductive element on the second surface of the space transformer substrate;
    an SMT resistor electrically connected to the first conductive element; and
    an electrical interconnect between the SMT capacitor and a second conductive element, the second conductive element on the second surface of the probe contactor substrate.

12. The probe head of claim 1, wherein the cavity is a non-through-hole cavity in the second surface of the probe contactor substrate.

13. The probe head of claim 12, further comprising a pedestal substrate, wherein the pedestal substrate is positioned in the non-through-hole cavity, and the SMT electronic component is positioned on the pedestal substrate.

14. The probe head of claim 12, wherein the SMT electronic component is an SMT capacitor, the probe head further comprising:
    a first conductive element on the second surface of the space transformer substrate;
    an SMT resistor electrically connected to the first conductive element; and
    an electrical interconnect between the SMT capacitor and a second conductive element, the second conductive element on the second surface of the probe contactor substrate.

15. The probe head of claim 1, wherein the cavity is a non-through-hole cavity in the first surface of the probe contactor substrate.

16. The probe head of claim 15, wherein the SMT electronic component is mounted on the second surface of the space transformer substrate.

17. The probe head of claim 1, wherein the probe contactor substrate is a ceramic substrate.

18. The probe head of claim 1, wherein the SMT electronic component is selected from the group consisting of: an SMT resistor and an SMT capacitor.

19. A probe head for a microelectronic contactor assembly, the probe head comprising:
    a space transformer substrate having a first surface opposite a second surface and a space transforming electrical interconnect therebetween, the space transforming electrical interconnect including electrical contacts on both the first surface and the second surface of the space transformer substrate;
    a probe contactor substrate having a first surface opposite a second surface, the probe contactor substrate coupled to the space transformer substrate with the first surface of the probe contactor substrate facing the second surface of the space transformer substrate, the second surface of the probe contactor substrate having a plurality of microelectronic contactors thereon that are electrically connected to the electrical contacts on the second surface of the space transformer substrate; and a surface mount technology (SMT) electronic component mounted on the second surface of the space transformer substrate, at a position between the first surface of the probe contactor substrate and the second surface of the space transformer substrate.

20. The probe head of claim 19, wherein the SMT electronic component is selected from the group consisting of: an SMT resistor and an SMT capacitor.

21. A method of forming a probe head for a microelectronic contactor assembly, the method comprising:

constructing a space transformer substrate having a first surface opposite a second surface and a space transforming electrical interconnect therebetween, the space transforming electrical interconnect including electrical contacts on both the first surface and the second surface of the space transformer substrate;

electrically connecting a number of surface mount technology (SMT) electronic components to ones of the electrical contacts on the second surface of the space transformer substrate;

constructing a probe contactor substrate having a first surface opposite a second surface, the constructing including i) forming a cavity in the probe contactor substrate, and ii) mechanically coupling a plurality of microelectronic contactors to the second surface of the probe contactor substrate; and after i) electrically connecting the number of SMT electronic components on the second surface of the space transformer substrate, and ii) mechanically coupling the plurality of microelectronic contactors to the second surface of the probe contactor substrate, coupling the probe contactor substrate to the space transformer substrate with the first surface of the probe contactor substrate facing the second surface of the space transformer substrate; and electrically connecting the plurality of microelectronic contactors to ones of the electrical contacts on the second surface of the space transformer substrate.

22. The method of claim 21, wherein electrically connecting a number of SMT electronic components to ones of the electrical contacts on the second surface of the space transformer substrate comprises:

electrically connecting a number of SMT resistors to ones of the electrical contacts on the second surface of the space transformer substrate.

23. The method of claim 21, further comprising:

positioning at least one of the SMT electronic components at a position that is between the first surface of the probe contactor substrate and the second surface of the space transformer substrate when the probe contactor substrate and the space transformer substrate are coupled.

* * * * *